United States Patent
Kuhr et al.

(10) Patent No.: US 12,094,998 B2
(45) Date of Patent: Sep. 17, 2024

(54) GROUP III NITRIDE BASED LED STRUCTURES INCLUDING MULTIPLE QUANTUM WELLS WITH BARRIER-WELL UNIT INTERFACE LAYERS

(71) Applicant: CreeLED, Inc., Durham, NC (US)

(72) Inventors: Thomas A. Kuhr, Durham, NC (US); Robert David Schmidt, Wake Forest, NC (US); Daniel Carleton Driscoll, Cary, NC (US); Brian T. Collins, Holly Springs, NC (US)

(73) Assignee: CreeLED, Inc., Durham, NC (US)

(*) Notice: Subject to any disclaimer, the term of this patent is extended or adjusted under 35 U.S.C. 154(b) by 23 days.

(21) Appl. No.: 17/377,833

(22) Filed: Jul. 16, 2021

(65) Prior Publication Data
US 2021/0343893 A1    Nov. 4, 2021

Related U.S. Application Data

(60) Continuation of application No. 16/998,651, filed on Aug. 20, 2020, now Pat. No. 11,088,295, which is a
(Continued)

(51) Int. Cl.
*H01L 33/00* (2010.01)
*H01L 33/02* (2010.01)
(Continued)

(52) U.S. Cl.
CPC .......... *H01L 33/0025* (2013.01); *H01L 33/02* (2013.01); *H01L 33/06* (2013.01); *H01L 33/32* (2013.01)

(58) Field of Classification Search
CPC ..... H01L 33/0025; H01L 33/02; H01L 33/06; H01L 33/32
See application file for complete search history.

(56) References Cited

U.S. PATENT DOCUMENTS

| | | | |
|---|---|---|---|
| 5,393,993 | A | 2/1995 | Edmond et al. |
| 5,523,589 | A | 6/1996 | Edmond et al. |

(Continued)

FOREIGN PATENT DOCUMENTS

| | | |
|---|---|---|
| JP | 2001007379 A | 1/2001 |
| JP | 4899632 B2 | 3/2012 |
| WO | 2013128894 A1 | 9/2013 |

OTHER PUBLICATIONS

Non-Final Office Action for U.S. Appl. No. 16/118,788, mailed Sep. 30, 2021, 22 pages.
(Continued)

*Primary Examiner* — Monica D Harrison
*Assistant Examiner* — Andre C Stevenson
(74) *Attorney, Agent, or Firm* — Withrow & Terranova, P.L.L.C.; Vincent K. Gustafson

(57) ABSTRACT

Group III nitride based light emitting diode (LED) structures include multiple quantum wells with barrier-well units that include III nitride interface layers. Each interface layer may have a thickness of no greater than about 30% of an adjacent well layer, and a comparatively low concentration of indium or aluminum. One or more interface layers may be present in a barrier-well unit. Multiple barrier-well units having different properties may be provided in a single active region.

18 Claims, 5 Drawing Sheets

Related U.S. Application Data continuation of application No. 16/267,636, filed on Feb. 5, 2019, now Pat. No. 10,756,231, which is a division of application No. 15/970,959, filed on May 4, 2018, now Pat. No. 10,224,454, which is a division of application No. 14/546,524, filed on Nov. 18, 2014, now Pat. No. 9,985,168.

(51) Int. Cl.
  *H01L 33/06* (2010.01)
  *H01L 33/32* (2010.01)

(56) References Cited

U.S. PATENT DOCUMENTS

| | | | |
|---|---|---|---|
| 6,201,262 | B1 | 3/2001 | Edmond et al. |
| 6,479,836 | B1 | 11/2002 | Suzuki et al. |
| 6,515,313 | B1 | 2/2003 | Ibbetson et al. |
| 6,998,284 | B2 | 2/2006 | Kyono et al. |
| 7,030,414 | B2 | 4/2006 | Asami et al. |
| 7,034,328 | B2 | 4/2006 | Doverspike et al. |
| 7,611,917 | B2 | 11/2009 | Emerson et al. |
| 7,692,182 | B2 | 4/2010 | Bergmann et al. |
| 7,692,209 | B2 | 4/2010 | Edmond et al. |
| RE42,007 | E | 12/2010 | Doverspike et al. |
| 8,000,366 | B2 | 8/2011 | Bour et al. |
| 8,247,792 | B2 | 8/2012 | Kim |
| 8,390,004 | B2 | 3/2013 | Avramescu et al. |
| 8,451,877 | B1 | 5/2013 | Crawford et al. |
| 8,536,615 | B1 | 9/2013 | Driscoll et al. |
| 8,575,592 | B2 | 11/2013 | Bergmann et al. |
| 9,985,168 | B1 | 5/2018 | Kuhr et al. |
| 10,224,454 | B2 | 3/2019 | Kuhr et al. |
| 10,756,231 | B2 | 8/2020 | Kuhr et al. |
| 2005/0191778 | A1 | 9/2005 | Ohtsuka et al. |
| 2008/0237570 | A1 | 10/2008 | Choi et al. |
| 2009/0152586 | A1* | 6/2009 | Lee .................. H01L 33/06 257/E33.001 |
| 2009/0206325 | A1 | 8/2009 | Biwa et al. |
| 2010/0123119 | A1 | 5/2010 | Kim et al. |
| 2010/0187497 | A1 | 7/2010 | Nago et al. |
| 2011/0187294 | A1 | 8/2011 | Bergmann et al. |
| 2012/0056157 | A1* | 3/2012 | Hikosaka .......... H01S 5/3407 438/47 |
| 2012/0153258 | A1 | 6/2012 | Kato et al. |
| 2012/0241770 | A1* | 9/2012 | Na .................. H01L 33/06 257/86 |
| 2012/0248407 | A1 | 10/2012 | Toyoda et al. |
| 2012/0298955 | A1 | 11/2012 | Emerson et al. |
| 2013/0069033 | A1 | 3/2013 | Kushibe et al. |
| 2013/0153858 | A1 | 6/2013 | Konno et al. |
| 2013/0328010 | A1 | 12/2013 | Yu et al. |
| 2013/0341593 | A1 | 12/2013 | Bergmann et al. |
| 2014/0048771 | A1 | 2/2014 | Takahashi et al. |
| 2015/0034900 | A1 | 2/2015 | Aihara |
| 2015/0083994 | A1 | 3/2015 | Jain et al. |
| 2015/0221815 | A1 | 8/2015 | Clatterbuck et al. |
| 2016/0093770 | A1 | 3/2016 | Shen et al. |
| 2017/0098746 | A1 | 4/2017 | Bergmann et al. |
| 2018/0108805 | A1 | 4/2018 | Shatalov et al. |
| 2018/0226538 | A1 | 8/2018 | Shur et al. |
| 2018/0254377 | A1 | 9/2018 | Kuhr et al. |
| 2020/0075798 | A1 | 3/2020 | Sokol et al. |

OTHER PUBLICATIONS

Non-Final Office Action for U.S. Appl. No. 14/546,524, mailed Jul. 6, 2015, 9 pages.
Final Office Action for U.S. Appl. No. 14/546,524, mailed Oct. 2, 2015, 11 pages.
Final Office Action for U.S. Appl. No. 14/546,524, mailed Dec. 30, 2015, 14 pages.
Advisory Action for U.S. Appl. No. 14/546,524, mailed Apr. 5, 2016, 3 pages.
Notice of Allowance for U.S. Appl. No. 14/546,524, mailed Jan. 25, 2018, 7 pages.
Notice of Allowance and Examiner-Initiated Interview Summary for U.S. Appl. No. 15/970,959, mailed Oct. 19, 2018, 11 pages.
Non-Final Office Action for U.S. Appl. No. 16/267,636, mailed Dec. 13, 2019, 14 pages.
Notice of Allowance for U.S. Appl. No. 16/267,636, mailed Apr. 16, 2020, 9 pages.
Non-Final Office Action for U.S. Appl. No. 16/118,788, mailed Apr. 13, 2020, 45 pages.
Non-Final Office Action for U.S. Appl. No. 16/998,651, mailed Oct. 2, 2020, 9 pages.
Notice of Allowance for U.S. Appl. No. 16/998,651, mailed Feb. 22, 2021, 9 pages.
Final Office Action for U.S. Appl. No. 16/118,788, mailed Nov. 5, 2020, 43 pages.
Advisory Action for U.S. Appl. No. 16/118,788, mailed Mar. 30, 2021, 4 pages.
Non-Final Office Action for U.S. Appl. No. 16/118,788, mailed May 11, 2021, 31 pages.
Kwon et al., "Gradient Doping of Mg in p-Type GaN for High Efficiency InGaN-GaN Ultravioulet Light-Emitting Diode," IEEE Photonics Technology Letters, vol. 19, No. 23, Dec. 1, 2007, pp. 1880-1882.
Notice of Allowance for U.S. Appl. No. 16/118,788, mailed Mar. 10, 2022, 7 pages.

* cited by examiner

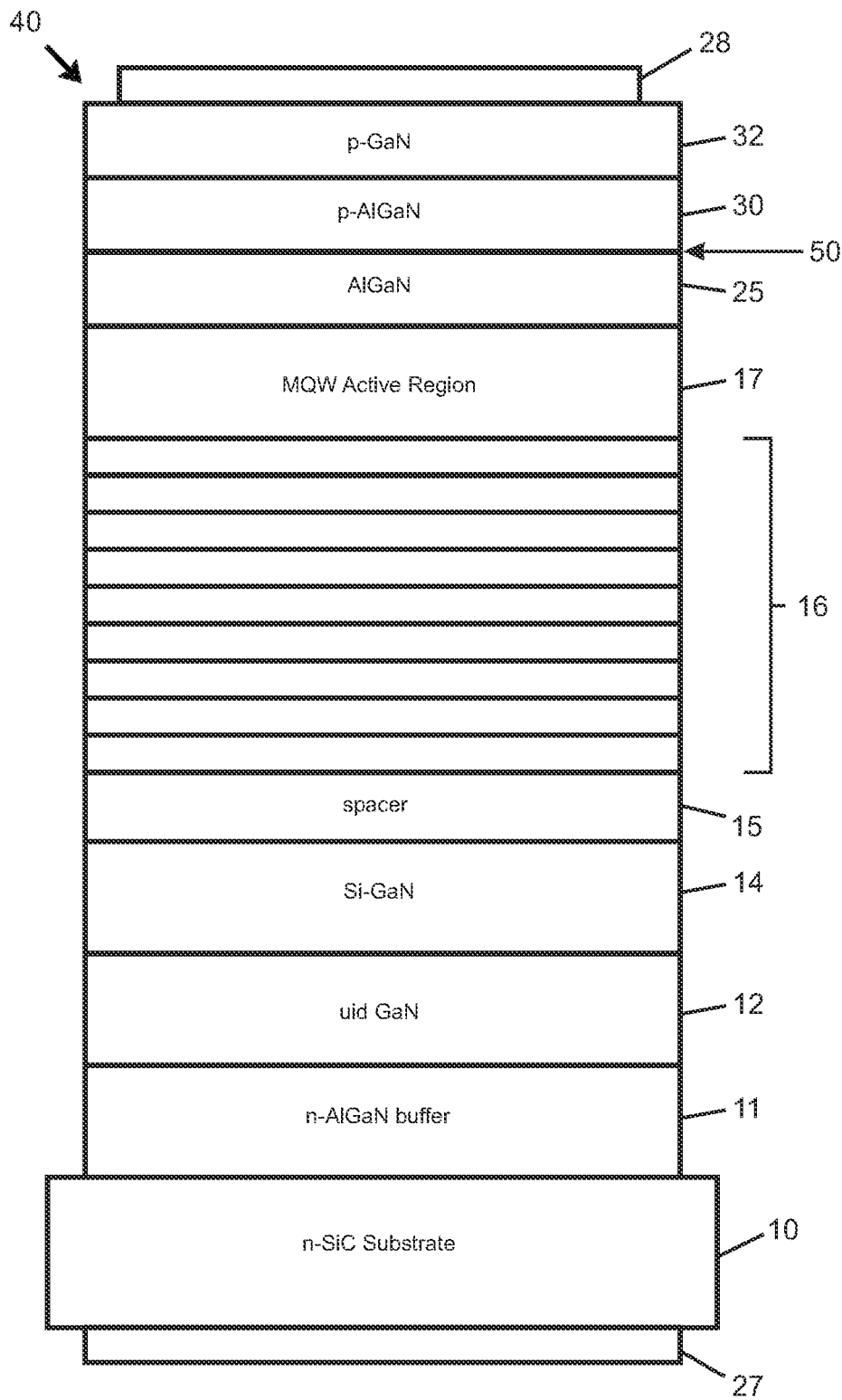
FIG_1

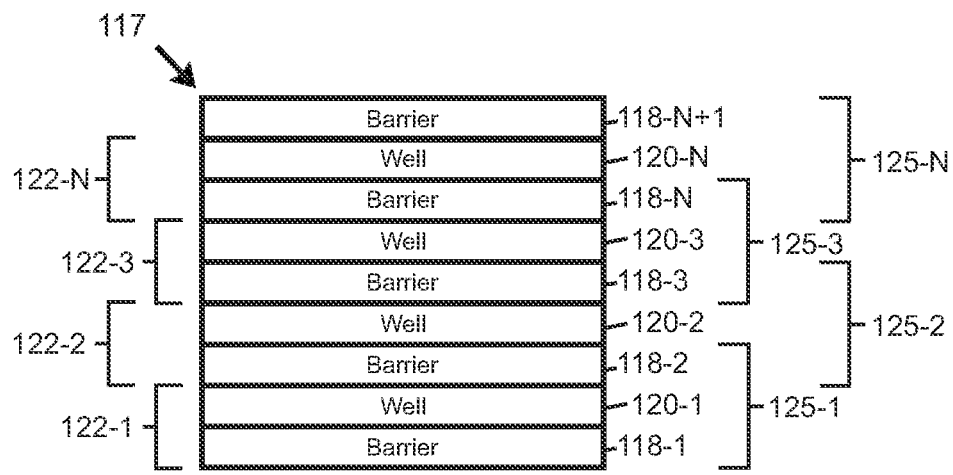
FIG._2
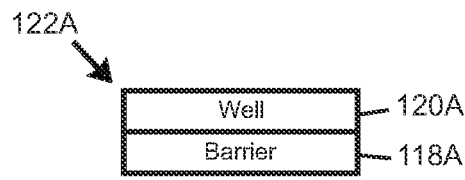
FIG._3A
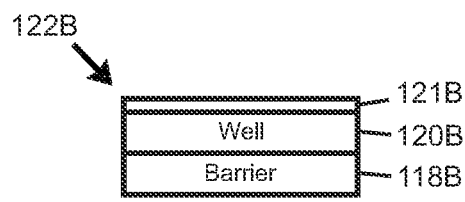
FIG._3B
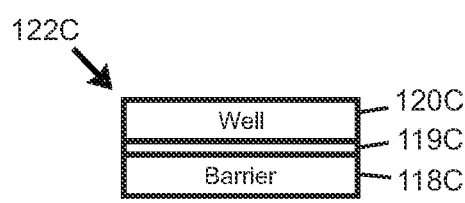
FIG._3C
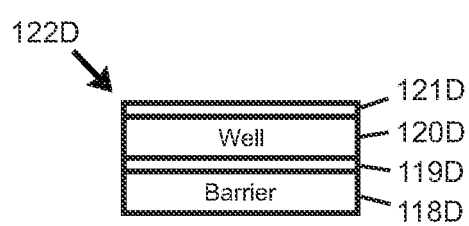
FIG._3D

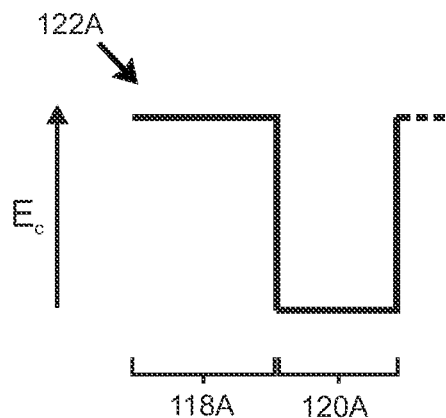
FIG._4A
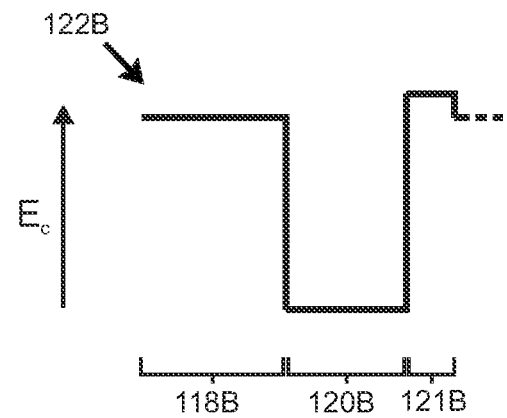
FIG._4B1
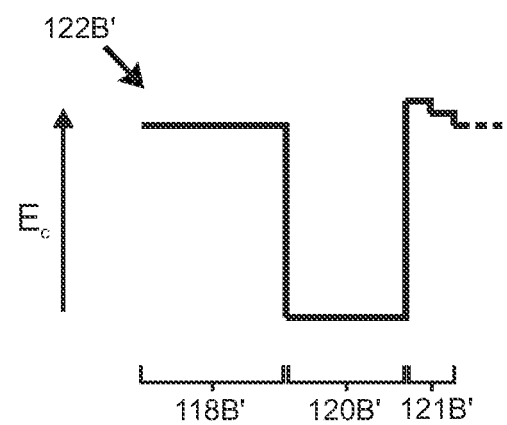
FIG._4B2
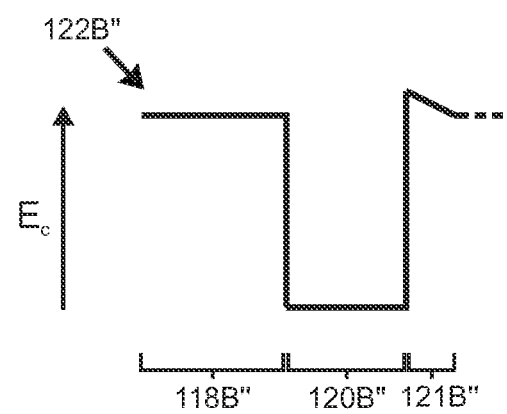
FIG._4B3

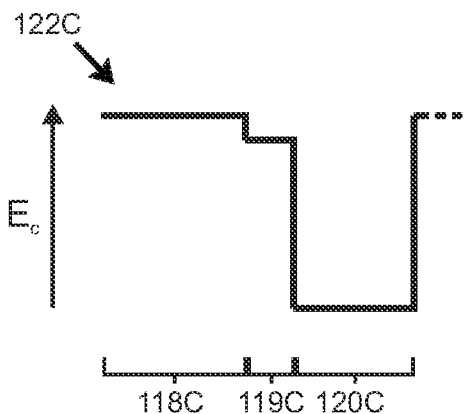
FIG._4C1
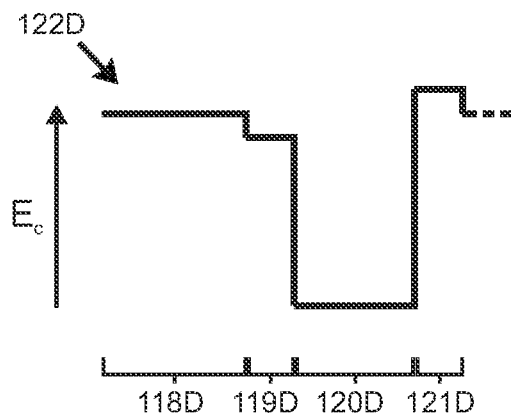
FIG._4D1
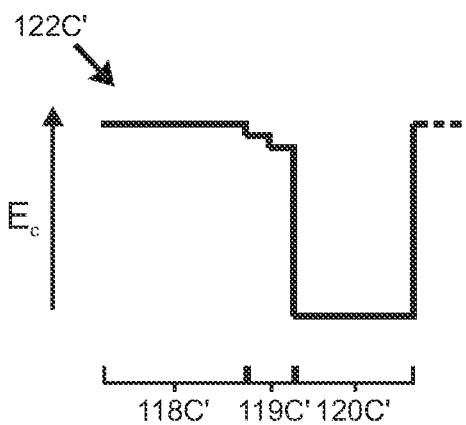
FIG._4C2
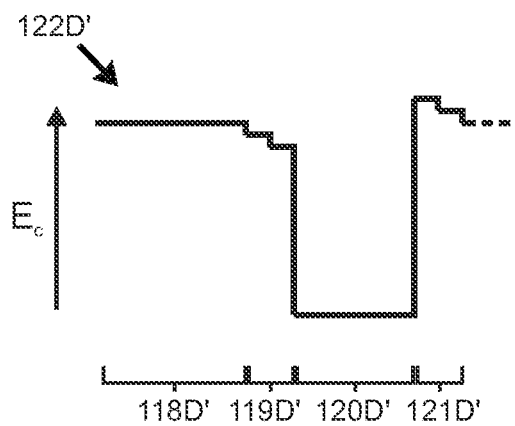
FIG._4D2
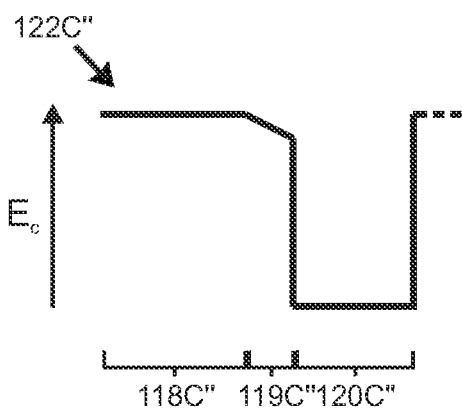
FIG._4C3
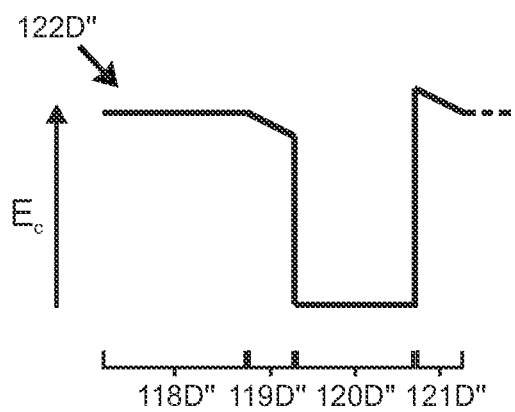
FIG._4D3

GROUP III NITRIDE BASED LED STRUCTURES INCLUDING MULTIPLE QUANTUM WELLS WITH BARRIER-WELL UNIT INTERFACE LAYERS

CROSS-REFERENCE TO RELATED APPLICATIONS

This application is a continuation of U.S. patent application Ser. No. 16/998,651 filed on Aug. 20, 2020, and subsequently issued as U.S. Pat. No. 11,088,295, which is a continuation of U.S. patent application Ser. No. 16/267,636 filed on Feb. 5, 2019 and subsequently issued as U.S. Pat. No. 10,756,231, which is a divisional of U.S. patent application Ser. No. 15/970,959 filed on May 4, 2018 and subsequently issued as U.S. Pat. No. 10,224,454, which is a divisional of U.S. patent application Ser. No. 14/546,524, filed on Nov. 18, 2014 and subsequently issued as U.S. Pat. No. 9,985,168, with the disclosures of the foregoing applications and patents being hereby incorporated herein by reference in their entireties.

FIELD OF THE DISCLOSURE

The present disclosure relates to microelectronic devices and associated fabrication methods, and more particularly to structures that may be utilized in Group III nitride based semiconductor devices such as light emitting diodes (LEDs).

BACKGROUND

Light emitting diodes (LEDs) are widely used in consumer and commercial applications. Continued developments in LED technology have resulted in highly efficient and mechanically robust light sources arranged to output emissions in the visible spectrum and beyond. These attributes, coupled with the long service life of solid state devices, have enabled a variety of new display applications, and have resulted in use of LEDs in general illumination applications with the potential to replace incandescent and fluorescent lamps.

As is well known to those skilled in the art, a light emitting diode generally includes an active region fabricated from a material having a suitable bandgap such that electron-hole recombination results in the generation of light when current is passed through the device. In particular, materials in the Group III nitride material system, such as GaN, InGaN, AlGaN, InAlGaN, etc., have been proven useful for generating blue, green, and ultraviolet light with relatively high efficiency.

Group III nitride based LEDs may be fabricated on growth substrates (e.g., silicon carbide substrates) to provide horizontal devices (with both electrical contacts on a same side of the LED) or vertical devices (with electrical contacts on opposite sides of the LED). The growth substrate may be maintained on the LED after fabrication, or may be removed such as by chemical etching, grinding, polishing, laser lift-off, or other suitable processes. Removal of a growth substrate may beneficially reduce a thickness of the resulting LED and/or reduce a forward voltage through a vertical LED. A horizontal device (with or without the growth substrate), for example, may be flip chip bonded (e.g., using solder) to a carrier substrate or printed circuit board, or wire bonded. A vertical device (with or without the growth substrate) may include first and second terminals bonded to a carrier substrate or printed circuit board.

Attempts to improve the light output of Group III nitride based devices have included providing differing configurations of the active regions of the devices. Such attempts have, for example, included the use of single and/or double heterostructure active regions. Similarly, quantum well devices with one or more Group III nitride quantum wells have also been fabricated. While such attempts have improved the efficiency of Group III nitride based devices, further improvements may still be achieved.

One problem that has been experienced with Group III nitride devices is "current droop," a phenomenon in which light output increases with current density up to a point, and then begins to level off. Thus, device efficiency may drop off at higher currents. Without being bound by any particular theory, it is presently believed that current droop may be the result of one or more factors, including saturation of hole injection and/or inefficient (i.e., non-light generating) electron-hole recombination at higher device currents. A similar or related problem that has been experienced with Group III nitride based devices is "thermal droop," a phenomenon in which light output decreases with elevated operating temperature. Such phenomenon may be attributable at least in part to the fact that the probability of non-radiative (i.e., non-light-emitting) recombination of electrons and holes increases with temperature. Reductions in luminous flux may cause undesirable and perceptible color shifts at elevated temperatures, particularly in lighting devices with multiple emitters.

Additional considerations that impact Group III nitride device design and/or operation are efficiency and forward voltage. Adjustment of certain parameters that may beneficially enhance charge confinement in quantum wells may also result in detrimental increases in forward voltage (i.e., the minimum voltage difference between the anode and cathode required to conduct electricity and activate a LED). Balancing such considerations can complicate Group III nitride based device design.

A need exists for Group III nitride based devices with improved performance.

SUMMARY

The present disclosure relates to Group III nitride based light emitting diode (LED) structures including multiple quantum wells with barrier-well units that include Group III nitride interface layers. Such interface layers may embody thin layers (e.g., preferably less than 10 Å, 5 Å, or another thickness threshold disclosed herein, and/or preferably a thickness of no greater than about 30%, no greater than 25%, or no greater than 20% of an adjacent well layer) of various compositions, of various gradient profiles, and in various combinations and positions. In certain embodiments, Group III nitride interface layers may comprise $Al_d In_e Ga_{(1-d-e)}N$. In certain embodiments, interface layers having low but non-zero concentrations of aluminum (e.g., less than about 10%, less than or equal to about 5%, less than or equal to about 4%, optionally bounded by a floor of greater than about 0.1%, and/or greater than about 1%, of metal present in a Group III nitride material) are provided. In certain embodiments, interface layers having low but non-zero concentrations of indium (e.g., less than about 10%, less than or equal to about 5%, less than or equal to about 4%, optionally bounded by a floor of greater than about 0.1%, and/or greater than about 1%, of metal present in a III nitride material) are provided. In certain embodiments, multiple barrier-well units having different properties are contained in a single active region. Presence of interface layers in barrier-well units of multiple quantum well active regions may beneficially enhance luminous flux, enhance efficiency, reduce thermal droop, and/or reduce forward voltage of light emitting diodes.

In one aspect, a light emitting diode (LED) comprises: an active region comprising a plurality of sequentially arranged barrier-well units; wherein each barrier-well unit comprises an $Al_aIn_bGa_{1-a-b}N$ barrier layer and an $In_cGa_{1-c}N$ well layer; and wherein at least one barrier-well unit, but fewer than all barrier-well units, of the plurality of sequentially arranged barrier-well units, additionally comprises an $Al_yIn_zGa_{1-y-z}N$ interface layer (wherein y>0 and wherein y≥z). In certain embodiments, the LED comprises at least one (or multiple) of the following features (i) to (vi): (i) c>0.10 and c>2·b; (ii) 0≤a≤0.50 and 0≤b≤0.10; (iii) y≤0.10; (iv) y≥4·z; (v) z=0 and (vi) y≤0.05 and 0≤z≤0.01. In certain embodiments, in the at least one barrier-well unit, the $Al_yIn_zGa_{1-y-z}N$ interface layer is in contact with the $In_cGa_{1-c}N$ well layer and is in contact with a barrier layer of an adjacent barrier-well unit of the plurality of sequentially arranged barrier-well units. In certain embodiments, the $Al_yIn_zGa_{1-y-z}N$ interface layer comprises a thickness of no greater than 10 Å (or no greater than 4 Å) and/or the $Al_yIn_zGa_{1-y-z}N$ interface layer comprises a thickness of no greater than about 30% of the $In_cGa_{1-c}N$ well layer. In certain embodiments, wherein at least one barrier-well unit comprises an $Al_wIn_xGa_{1-w-x}N$ interface layer, which in certain embodiments may be provided between and in contact with the $Al_aIn_bGa_{1-a-b}N$ barrier layer and the $In_cGa_{1-c}N$ well layer. In certain embodiments, x>0 and x>w. In certain embodiments, x≠y and/or w≠z. In certain embodiments, each well layer comprises a thickness in a range of from 15 Å to 40 Å and/or each barrier layer comprises a thickness in a range of from 25 Å to 150 Å.

In another aspect, a light emitting diode comprises an active region comprising a plurality of sequentially arranged barrier-well units; wherein the plurality of sequentially arranged barrier-well units comprises at least one barrier-well unit of a first type, and each barrier-well unit of the first type comprises an $Al_{a1}In_{b1}Ga_{1-a1-b1}N$ barrier layer, an $In_{c1}Ga_{1-c1}N$ well layer, an $Al_{w1}In_{x1}Ga_{1-w1-x1}N$ interface layer (wherein x1>0 and wherein x1≥w1), and an $Al_{y1}In_{z1}Ga_{1-y1-z1}N$ interface layer (wherein y1>0 and wherein y1≥z1). In certain embodiments, the LED comprises at least one (or multiple) of the following features (i) to (vi): (i) c>0.10 and c>2·b; (ii) 0≤a≤0.50 and 0≤b≤0.10; (iii) y1≤0.10; (iv) y1≥4·z1; (v) z1=0; and (vi) y1≤0.05 and 0≤z1≤0.01. In certain embodiments, one or both of the $Al_{w1}In_{x1}Ga_{1-w1-x1}N$ interface layer and the $Al_{y1}In_{z1}Ga_{1-y1-z1}N$ interface layer comprises a thickness of no greater than 10 Å (or no greater than 4 Å) and/or a thickness of no greater than about 30% of the $In_{c1}Ga_{1-c1}N$ well layer. In certain embodiments, in the at least one barrier-well unit of a first type, the $Al_{w1}In_{x1}Ga_{1-w1-x1}N$ interface layer is arranged between and in contact with the $Al_{a1}In_{b1}Ga_{1-a1-b1}N$ barrier layer and the $In_{c1}Ga_{1-c1}N$ well layer, and the $Al_{y1}In_{z1}Ga_{1-y1-z1}N$ interface layer is arranged in contact with the $In_{c1}Ga_{1-c1}N$ well layer. In certain embodiments, the LED comprises at least one barrier-well unit of a second type, and each barrier-well unit of the second type comprises an $Al_{a2}In_{b2}Ga_{1-a2-b2}N$ barrier layer, an $In_{c2}Ga_{1-c2}N$ well layer, and an $Al_{y2}In_{z2}Ga_{1-y2-z2}N$ interface layer (wherein y2>0 and wherein y2≥z2). In certain embodiments, the at least one barrier-well unit of the first type comprises a plurality of barrier-well units of the first type, and a number of barrier-well units of the first type exceeds a number of barrier-well units of the second type present in the light emitting diode. In certain embodiments, the number of barrier-well units of the first type is fewer than a total number of barrier-well units of the active region. In certain embodiments, each well layer comprises a thickness in a range of from 15 Å to 40 Å and/or each barrier layer comprises a thickness in a range of from 25 Å to 150 Å.

In another aspect, a light emitting diode comprises an active region comprising a plurality of sequentially arranged barrier-well units; wherein the plurality of sequentially arranged barrier-well units comprises at least one barrier-well unit of a first type, and each barrier-well unit of the first type comprises a Group III nitride barrier layer comprising a first bandgap, a Group III nitride well layer comprising a second bandgap, a first Group III nitride interface layer comprising a third bandgap, and a second Group III nitride interface layer comprising a fourth bandgap; and wherein the third bandgap is greater than the second bandgap, the first bandgap is greater than the third bandgap, and the fourth bandgap is greater than the first bandgap. In certain embodiments, the Group III nitride barrier layer comprises an $Al_{a1}In_{b1}Ga_{1-a1-b1}N$ barrier layer, the Group III nitride well layer comprises an $In_{c1}Ga_{1-c1}N$ well layer, the first Group III nitride interface layer comprises an $Al_wIn_xGa_{1-w-x}N$ interface layer (wherein x>0 and wherein x≥w), and the second Group III nitride interface layer comprises an $Al_{y1}In_{z1}Ga_{1-y1-z1}N$ interface layer (wherein y1>0 and wherein y1≥z1). In certain embodiments, one or both of the first Group III nitride interface layer and the second Group III nitride interface layer comprises a thickness of no greater than 10 Å (or no greater than 4 Å) and/or a thickness of no greater than about 30% of the Group III nitride well layer. In certain embodiments, in the at least one barrier-well unit of the first type, the first Group III nitride interface layer is arranged between and in contact with the Group III nitride barrier layer and the Group III nitride well layer, and the second Group III nitride interface layer is arranged in contact with the Group III nitride well layer. In certain embodiments, the plurality of sequentially arranged barrier-well units comprises at least one barrier-well unit of a second type, and each barrier-well unit of the second type comprises a second Group III nitride barrier layer comprising a fifth bandgap, a second Group III nitride well layer comprising a sixth bandgap, and a third Group III nitride interface layer comprising a seventh bandgap; wherein the fifth bandgap is greater than the sixth bandgap, and the seventh bandgap is greater than the fifth bandgap. In certain embodiments, the second Group III nitride barrier layer comprises an $Al_{a2}In_{b2}Ga_{1-a2-b2}N$ barrier layer, the second Group III nitride well layer comprises an $In_{c2}Ga_{1-c2}N$ well layer, and the third Group III nitride interface layer comprises $Al_{y2}In_{z2}Ga_{1-y2-z2}N$ interface layer (wherein y2>0 and wherein y2≥z2). In certain embodiments, the at least one barrier-well unit of the first type comprises a plurality of barrier-well units of the first type, and a number of barrier-well units of the first type exceeds a number of barrier-well units of the second type present in the LED. In certain embodiments, the number of barrier-well units of the first type is fewer than a total number of barrier-well units of the active region. In certain embodiments, each well layer comprises a thickness in a range of from 15 Å to 40 Å and/or each barrier layer comprises a thickness in a range of from 25 Å to 150 Å.

In another aspect, a light emitting diode comprises an active region comprising a plurality of sequentially arranged barrier-well units; wherein each barrier-well unit comprises a Group III nitride barrier layer comprising a first bandgap and a Group III nitride well layer comprising a second bandgap; wherein at least one barrier-well unit, but fewer than all barrier-well units, of the plurality of sequentially arranged barrier-well units, additionally comprises a first Group III nitride interface layer comprising a third bandgap; and wherein the first bandgap is greater than the second bandgap, and the third bandgap is greater than the first bandgap. In certain embodiments, a Group III nitride well layer comprises an $In_{c1}Ga_{1-c1}N$ well layer, and the first Group III nitride interface layer comprises an $Al_yIn_zGa_{1-y-z}N$ interface layer (wherein y>0 and wherein y≥z). In certain embodiments, the first Group III nitride interface layer comprises a thickness of no greater than 10 Å (or no greater than 4 Å) and/or a thickness of no greater than about 30% of the Group III nitride well layer. In certain embodiments, in the at least one barrier-well unit, the first Group III nitride interface layer is in contact with the Group III nitride well layer and is in contact with a Group III nitride barrier layer of an adjacent barrier-well unit of the plurality of sequentially arranged barrier-well units. In certain embodiments, at least one barrier-well unit comprises a second Group III nitride interface layer comprising a fourth bandgap, wherein the fourth bandgap is greater than the second bandgap, and wherein the first bandgap is greater than the fourth bandgap. In certain embodiments, for the at least one barrier-well unit that comprises the second Group III nitride interface layer, the second Group III nitride interface layer is provided between and in contact with the Group III nitride barrier layer and the Group III nitride well layer. In certain embodiments, each well layer comprises a thickness in a range of from 15 Å to 40 Å and/or each barrier layer comprises a thickness in a range of from 25 Å to 150 Å.

In another aspect, a light emitting diode comprises an active region comprising a plurality of sequentially arranged barrier-well units; wherein each barrier-well unit of the first type comprises an $Al_{a1}In_{b1}Ga_{1-a1-b1}N$ barrier layer (wherein at least one of the following is true: a1<0.2 and b1=0), an $In_{c1}Ga_{1-c1}N$ well layer, and an $Al_{w1}In_{x1}Ga_{1-w1-x1}N$ interface layer (wherein 0<x1<0.05, w1+x1<1, and b1<x1<c1); and wherein the $Al_{w1}In_{x1}Ga_{1-w1-x1}N$ interface layer comprises a thickness of no greater than about 30% of a thickness of the $In_{c1}Ga_{1-c1}N$ well layer. In certain embodiments, a LED comprises at least one (or multiple) of the following features (i) to (iv): (i) c>0.10 and c>2·b; (ii) 0≤a≤0.50 and 0≤b≤0.10; (iii) x1≥4·w1; and (iv) 0≤w1≤0.01. In certain embodiments, the $Al_{w1}In_{x1}Ga_{1-w1-x1}N$ interface layer comprises a thickness of no greater than 10 Å (or no greater than 4 Å). In certain embodiments, in the at least one barrier-well unit of a first type, the $Al_{w1}In_{x1}Ga_{1-w1-x1}N$ interface layer is arranged between and in contact with the $Al_{a1}In_{b1}Ga_{1-a1-b1}N$ barrier layer and the $In_{c1}Ga_{1-c1}N$ well layer. In certain embodiments, at least one barrier-well unit of the plurality of sequentially arranged barrier-well units comprises an $Al_yIn_zGa_{1-y-z}N$ interface layer (wherein y>0 and wherein y≥z). In certain embodiments, 0<z≤0.01. In certain embodiments, in the at least one barrier-well unit, the $Al_yIn_zGa_{1-y-z}N$ interface layer is in contact with the $In_cGa_{1-c}N$ well layer and is in contact with an $Al_{a1}In_{b1}Ga_{1-a1-b1}N$ barrier layer of an adjacent barrier-well unit of the plurality of sequentially arranged barrier-well units. In certain embodiments, the plurality of sequentially arranged barrier-well units comprises at least one barrier-well unit of a second type, and each barrier-well unit of the second type comprises an $Al_{a2}In_{b2}Ga_{1-a2-b2}N$ barrier layer, an $In_{c2}Ga_{1-c2}N$ well layer, an $Al_{y2}In_{z2}Ga_{1-y2-z2}N$ interface layer (wherein y2>0 and wherein y2≥z2), and an $Al_{w2}In_{x2}Ga_{1-w2-x2}N$ interface layer (wherein w2>0 and wherein w2≥x2). In certain embodiments, in the at least one barrier-well unit of the second type, the $Al_{w2}In_{x2}Ga_{1-w2-x2}N$ interface layer is arranged between and in contact with the $Al_{a2}In_{b2}Ga_{1-a2-b2}N$ barrier layer and the $In_{c2}Ga_{1-c2}N$ well layer, and the $Al_{y2}In_{z2}Ga_{1-y2-z2}N$ interface layer is arranged in contact with the $In_{c2}Ga_{1-c2}N$ well layer. In certain embodiments, the at least one barrier-well unit of the first type comprises a plurality of barrier-well units of the first type, and a number of barrier-well units of the first type exceeds a number of barrier-well units of the second type present in the light emitting diode. In certain embodiments, the number of barrier-well units of the first type is fewer than a total number of barrier-well units of the active region. In certain embodiments, each well layer comprises a thickness in a range of from 15 Å to 40 Å and/or each barrier layer comprises a thickness in a range of from 25 Å to 150 Å.

In certain embodiments, any above-mentioned active region may be arranged between (but not necessarily directly contacting) a p-type Group III nitride based semiconductor layer and a n-type Group III nitride based semiconductor layer of the LED.

In another aspect, any aspects or features disclosed herein may be combined for additional advantage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 1 is a cross-sectional schematic view of a light emitting diode (LED) structure according to one embodiment.

FIG. 2 is a side cross-sectional schematic view of an active region of a LED structure according to one embodiment.

FIG. 3A is a side cross-sectional schematic view of a barrier-well unit of a first type that may be provided in a quantity of one or more in conjunction with at least one barrier-well unit of another type in an active region of a LED structure according to one embodiment.

FIG. 3B is a side cross-sectional schematic view of a barrier-well unit of a second type that may be provided in a quantity of one or more, optionally in conjunction with at least one barrier-well unit of another type, in an active region of a LED structure according to one embodiment.

FIG. 3C is a side cross-sectional schematic view of a third barrier-well unit of a third type that may be provided in a quantity of one or more, optionally in conjunction with at least one barrier-well unit of another type, in an active region of a LED structure according to one embodiment.

FIG. 3D is a side cross-sectional schematic view of a barrier-well unit of a fourth type that may be provided in a quantity of one or more, optionally in conjunction with at least one barrier-well unit of another type, in an active region of a LED structure according to one embodiment.

FIG. 4A is a schematic conduction band diagram for the barrier-well unit of FIG. 3A.

FIG. 4B1 is a first schematic conduction band diagram for the barrier-well unit of FIG. 3B, with the interface layer including a substantially constant composition.

FIG. 4B2 is a second schematic conduction band diagram for the barrier-well unit of FIG. 3B, with the interface layer including a gradient composition that varies with thickness in a stepwise manner.

FIG. 4B3 is a third schematic conduction band diagram for the barrier-well unit of FIG. 3B, with the interface layer including a gradient composition that varies with thickness in a substantially continuous manner.

FIG. 4C1 is a first schematic conduction band diagram for the barrier-well unit of FIG. 3C, with the interface layer including a substantially constant composition.

FIG. 4C2 is a second schematic conduction band diagram for the barrier-well unit of FIG. 3C, with the interface layer including a gradient composition that varies with thickness in a stepwise manner.

FIG. 4C3 is a third schematic conduction band diagram for the barrier-well unit of FIG. 3C, with the interface layer including a gradient composition that varies with thickness in a substantially continuous manner.

FIG. 4D1 is a first schematic conduction band diagram for the barrier-well unit of FIG. 3D, with each interface layer including a substantially constant composition.

FIG. 4D2 is a second schematic conduction band diagram for the barrier-well unit of FIG. 3D, with each interface layer including a gradient composition that varies with thickness in a stepwise manner.

FIG. 4D3 is a third schematic conduction band diagram for the barrier-well unit of FIG. 3D, with each interface layer including a gradient composition that varies with thickness in a substantially continuous manner.

DETAILED DESCRIPTION

Figure 5A:
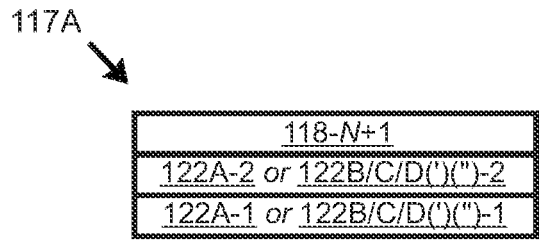
FIG. 5A is a side cross-sectional schematic view of an active region including two barrier-well units of a LED structure according to one embodiment.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein, but it should be understood that such concepts and applications are intended to fall within the scope of the disclosure and the accompanying claims.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" another element, it can be directly on the other element, or intervening elements may also be present. Likewise, it will be understood that when an element such as a layer, region, or substrate is referred to as being "over" or extending "over" another element, it can be directly over or extend directly over the other element, or intervening elements may also be present. Conversely, when an element is referred to as being "directly on" another element, no intervening elements are present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present disclosure will be described with reference to FIG. 1, which illustrates a light emitting diode (LED) structure 40. Although layers are illustrated in FIG. 1 as having various thicknesses, it is to be appreciated that such layers are not drawn to scale, such that FIG. 1 is schematic only.

The LED structure 40 of FIG. 1 includes a layered semiconductor structure comprising gallium nitride-based semiconductor layers on or over a substrate 10. As illustrated, the LED structure 40 includes the following layers: a nitride buffer layer 11 which may include AlGaN (e.g., n-AlGaN), a first nitride layer 12 which may include GaN, such as unintentionally doped GaN (uid GaN) or silicon-doped GaN, a second nitride layer 14 which may include silicon-doped GaN (Si—GaN), an optional spacer layer 15 which may include undoped GaN, a nitride superlattice structure 16 that may include alternating layers of silicon-doped GaN and/or InGaN, a nitride active region 17 which may embody a multiple well structure such as a multiple quantum well (MQW) structure, a nitride (e.g., undoped) cap layer 25 which may include AlGaN, a nitride layer 30 which may include AlGaN doped with a p-type impurity, and a nitride contact layer 32 also doped with a p-type impurity. A n-type ohmic contact 27 is provided on the substrate 10, and a p-type ohmic contact 28 is provided on the nitride contact layer 32.

The labels of layers in FIG. 1 are provided as examples only, such that structures according to certain embodiments herein may include layers formed of different materials than the specific materials indicated in FIG. 1.

Epitaxial layer structures for Group III nitride based LEDs are typically formed by growing the n-type (and undoped) layers first, then growing the p-type layers on or over the n-type layers, to avoid reactor memory effects which can cause p-type dopants to remain in the system even after the flow of the source gas for such dopants has been switched off. Thus, for example, an LED structure such as the structure 40 illustrated in FIG. 1 is typically formed by epitaxially growing, in order, the buffer layer 11, nitride layers 12, 14, the optional spacer layer 15, the superlattice structure 16, the active region 17, the cap layer 25, the p-AlGaN layer 30 and the nitride contact layer 32, on a growth substrate 10.

As used herein, an "active region" of a light emitting device refers to the region in which majority and minority electronic carriers (e.g., holes and electrons) recombine to produce light. In general, an active region according to embodiments disclosed herein can include a double heterostructure or a well structure, such as a quantum well structure. "Group III nitride layers" or "nitride layers" as used herein refer to nitride based III-V semiconductor layers, such as GaN, InN, AlN, InGaN, AlGaN and/or AlInGaN. In certain instances, Group III nitride materials are specified herein with subscripts (e.g., "a," "b," "d," "e," "w," "x," "y," "z," optionally modified with suffixes "1" or "2") denoting concentrations or relative concentrations of metals Al, In, and/or Ga. Unless indicated to the contrary herein, relative fractions of such metals may be in a range of from 0% to 100%.

The LED structure 40 illustrated in FIG. 1 includes a substrate 10, which may be any material compatible for growth of Group III nitride material layers. In certain embodiments, the substrate 10 may be 4H or 6H n-type silicon carbide. In other embodiments, the substrate 10 may include sapphire, gallium nitride, silicon, or other epitaxially compatible substrate materials. It is to be appreciated, however, that the substrate 10 is optional and may be omitted from the final LED device structure 40 in certain embodiments.

The nitride buffer layer 11 may include n-type AlGaN having a constant or graded aluminum composition. Examples of buffer layers between silicon carbide and Group III nitride materials are provided in U.S. Pat. Nos. 5,393,993, 5,523,589, and 7,034,328, which are assigned to the assignee of the present invention, with the disclosures of such patents being hereby incorporated by reference herein. Embodiments of the present disclosure may further include structures such as those described in U.S. Pat. No. 6,201,262 entitled "Group III Nitride Photonic Devices on Silicon Carbide Substrates with Conductive Buffer Interlayer Structure," with the disclosure of such patent being hereby incorporated by reference herein. In certain embodiments, the buffer layer 11 may have a thickness in a range of from 1000 Angstroms (Å) to about 5000 Å; in certain embodiments, the buffer layer 11 may have a thickness selected from one of, or in a range between two values of, the following values: 1800 Å, 2000 Å, 2200 Å, 2400 Å, 2600 Å, 2800 Å, 3000 Å, 3200 Å, 3400 Å, 3600 Å, 4000 Å, 4300 Å, 4700 Å, and 5000 Å.

Group III nitride based LEDs according to certain embodiments may be provided as horizontal devices (with both electrical contacts on a same side of the LED) or vertical devices (with electrical contacts on opposite sides of the LED). Moreover, the growth substrate may be maintained on the LED after fabrication, or may be removed by any appropriate process known in the art.

In certain embodiments, the first nitride layer 12 may have a thickness in a range of from 500 nm to 6000 nm, and in some embodiments may have a thickness of about 4000 nm. In other embodiments, the first nitride layer 12 may have a thickness in a range of from 500 Å to 30,000 Å, or a thickness of at least 7500 Å, at least 10,000 Å, at least 12,500 Å, at least 15,000 Å, or at least 17,500 Å, optionally bounded by an upper limit of 30,000 Å. In certain embodiments, the first nitride layer 12 may be unintentionally doped. In other embodiments, the first nitride layer 12 may be doped with silicon at a level of from about $5 \times 10^{17}$ cm$^{-3}$ to $7 \times 10^{18}$ cm$^{-3}$.

In certain embodiments, the second nitride layer 14 may have a thickness in a range of from about 10 Å to about 500 Å, with the thickness being about 80 Å in certain embodiments. In other embodiments, the second nitride layer 14 may have a thickness in a range of from 20,000 Å to 70,000 Å, or in a range of from 20,000 Å to 60,000 Å, or in a range of from 23,000 Å to 50,000 Å, or in a range of from 25,000 Å to 40,000 Å. In certain embodiments, the second nitride layer 14 may have a thickness of at least 20,000 Å, at least 23,000 Å, at least 25,000 Å, at least 27,000 Å, or at least 30,000 Å, with a maximum value corresponding bounding the preceding minimum thresholds preferably being about 50,000 Å in certain embodiments. In certain embodiments, the second nitride layer 14 may be doped with silicon at a level of less than about $5 \times 10^{19}$ cm$^{-3}$.

In certain embodiments, a superlattice structure 16 is provided between the substrate 10 and the active region 17. In certain embodiments, the superlattice structure 16 may be omitted. Omission of a superlattice structure 16 may be accompanied by presence of a second nitride layer 14 having a thickness of preferably at least about 20,000 Å, such as within a thickness range outlined above.

If present, the superlattice structure 16 may provide a better surface for growth of the nitride (e.g., InGaN-based) active region 17. While not wishing to be bound by any theory of operation, it is presently believed that strain effects in the superlattice structure 16 provide a growth surface that is conducive to the growth of a high-quality InGaN-containing active region. Further, a superlattice may influence the operating voltage of the device. Appropriate choice of thickness and composition of the superlattice structure 16 can reduce operating voltage and/or enhance optical efficiency.

In certain embodiments including a superlattice structure 16, the superlattice structure 16 may be grown in an atmosphere of nitrogen or other gas, enabling growth of high-quality InGaN layers. By growing a silicon-doped InGaN/GaN superlattice on a silicon-doped GaN layer in a nitrogen atmosphere, a structure having improved crystallinity and/or conductivity with optimized strain may be realized. In general, GaN-based layers in the structure may be grown using ammonia as a source gas together with one or more carrier gases such as hydrogen ($H_2$), nitrogen ($N_2$), inert gases, and/or mixtures thereof.

In certain embodiments including a superlattice structure 16, the superlattice structure 16 may include alternating layers of $In_xGa_{1-x}N$ and $In_yGa_{1-y}N$, wherein x is between 0 and 1 inclusive, and x is not equal to y. In certain embodiments, x=0, so that the superlattice structure 16 includes alternating layers of GaN and InGaN. In certain embodiments, each alternating layer of InGaN has a thickness in a range of from about 5 Å to 40 Å, and each of the alternating layers of GaN has a thickness in a range of from 5 Å to 100 Å. In certain embodiments, each GaN layer has a thickness of about 50 Å and each InGaN layer has a thickness of about 15 Å. In certain embodiments, the superlattice structure 16 may include from about 5 to about 50 periods (where one period equals one repetition of an $In_xGa_{1-x}N$ layer and an $In_yGa_{1-y}N$ layer of the repeating layers that form the superlattice structure 16). In certain embodiments, the superlattice structure 16 may include about twenty-five periods. In another embodiment, the superlattice structure 16 includes about ten periods. In certain embodiments, the number of periods, may be decreased, for example, by increasing the thickness of the respective layers. Thus, for example, doubling the thickness of the respective layers of the superlattice structure 16 may cause only half the number of periods to be used. In other embodiments, the number and thickness of the periods of layers of the superlattice structure 16 may be independent of one another.

In certain embodiments including a superlattice structure 16, the superlattice structure 16 may be doped with an n-type impurity such as silicon at a level of from about $1\times10^{17}$ cm$^{-3}$ to $5\times10^{19}$ cm$^{-3}$. Such a doping level may embody actual doping, or average doping, of the layers of the superlattice structure 16. If such doping embodies an average doping level, then it may be beneficial to provide doped layers adjacent the superlattice structure 16 whereby the adjacent doped layers (not shown) are considered together with the layers of the superlattice structure 16 for purposes of calculating a desired average doping level.

The active region 17 includes multiple light emitting wells that include thin layers of low bandgap semiconductor material sandwiched between higher bandgap cladding or confinement layers, and that may in some embodiments be quantum wells. As is known in the art, a well layer is a very thin layer of semiconductor material (typically less than about 50 nm) surrounded by barrier or confinement layers having higher bandgaps than the quantum well layer. The barrier layers and the well layer together form a quantum well. In particular, a quantum well layer is so thin that allowable energy levels in the quantum well take on discrete values, so that a quantum well exhibits a high density of states at the lowest allowed (discrete) energy level—as compared to bulk material, which has a smooth distribution of allowable energy levels. A quantum well may generate photons by carrier recombination with improved efficiency and/or spectral purity as compared to bulk recombination/emission. Carrier recombination occurs when an electron fills a space in a crystal lattice occupied by a hole and moves to a lower energy state, releasing energy in the form of heat and/or light. In various embodiments, the wells may or may not be thin enough to be characterized as quantum wells.

In certain embodiments disclosed herein, the active region 17 includes a multiple well structure that includes multiple barrier-well units (such as shown in FIG. 2).

In a LED structure 40 as illustrated in FIG. 1, minority carriers (e.g., holes) are injected from a P-N junction 50 into the active region 17. In certain embodiments, the P-N junction 50 is positioned at or near the active region 17, such as within a range of from 0 to 500 Å thereof. The injected minority carriers (e.g., holes) may diffuse into one of the quantum wells in the active region 17, where they can recombine with majority carriers (e.g., electrons) and result in the generation of photons of light. The P-N junction 50 may be positioned close enough to the active region 17 that an injected minority carrier can diffuse with a high probability into the active region 17 and recombine with a majority carrier in a quantum well.

Although the active region 17 may superficially resemble a superlattice, the active region 17 can be distinguished from the superlattice structure 16 (if present) in multiple ways. In particular, the bandgaps of the well layers in a well-based active region typically embody the lowest bandgaps of any layer in the device, so that carrier recombination is most likely to occur in a well layer of the active region. In certain embodiments, average percentages of indium in the superlattice structure 16 and the active region 17 are adjusted to ensure that the bandgap of the superlattice structure 16 exceeds the bandgap of the active region 17. By keeping the bandgap of the superlattice 16 higher than the bandgap of wells in the active region 17, unwanted absorption in the device may be reduced and luminescent emission may be increased. The bandgaps of the well layers in a well-based structure may be tailored to produce a desired wavelength of light emission. Furthermore, the active region 17 may be located closer to the P-N junction 50 than the proximity of the superlattice structure 16 to the P-N junction 50. Additionally, the superlattice structure 16 may be intentionally doped to enhance conductivity, while in certain embodiments, the layers of the active region 17 may typically be only unintentionally doped.

Continuing to refer to FIG. 1, a cap layer 25 is provided on the active region 17 and may include a layer of undoped GaN, AlGaN and/or AlInGaN. In certain embodiments, the cap layer 25 may have a thickness in a range of 1 Å to 300 Å. As used herein, "undoped" refers to a layer or region that is not intentionally doped with impurities, and is synonymous with "unintentionally doped." It will be appreciated that Group III nitride based materials are typically naturally n-type as grown, and therefore the cap layer 25 may be n-type as grown. In certain embodiments, the cap layer 25 may have a thickness of at least about 40 Å. If the cap layer 25 comprises AlGaN, then the aluminum percentage in such layer may be in a range of 0-70%, and in some cases may be about 55% or less. In certain embodiments, the presence or concentration of aluminum in the cap layer 25 may also be graded in a stepwise or continuously decreasing fashion. In certain embodiments, the cap layer 25 may be grown at a higher temperature than the temperature(s) at which one or more layers of the multiple quantum well active region 17 were grown in order to improve the crystal quality of the cap layer 25.

In certain embodiments, a p-type nitride-based layer 30 including AlGaN and/or AlInGaN doped with a p-type impurity such as magnesium is provided on the cap layer 25. In certain embodiments, the p-type nitride-based layer 30 may have a thickness in a range of from 0 Å to 300 Å, and in some cases may have a thickness of about 150 Å.

In certain embodiments, a contact layer 32 (e.g., including p-type GaN) is provided on the p-type nitride-based layer 30. The contact layer 32 may have a thickness in a range of from 500 Å to 2500 Å, and in some cases may have a thickness of about 1800 Å.

In certain embodiments, a P-N junction 50 may be formed at a junction between the p-type nitride-based layer 30 and the cap layer 25. In other embodiments, the p-type nitride-based layer 30 may be omitted so that a P-N junction 50 may be formed between the contact layer 32 and the cap layer 25. In further embodiments, a P-N junction 50 may be formed within the cap layer 25 by doping an upper portion of the cap layer 25 with p-type dopants. The P-N junction 50 serves as a mechanism for injecting minority carriers into the active region 17, where such carriers can recombine with majority carriers to generate photons and result in light emission.

In certain embodiments, a LED structure 40 may include enhancements configured to reduce luminous flux droop at elevated temperature. Such enhancements may include one, some, or all of the following features: (a) increasing thickness of a first nitride layer 12 (e.g., unintentionally doped GaN) arranged between the substrate 10 (if present) and a second nitride layer 14 (e.g., silicon doped GaN), (b) increasing thickness of the cap layer 25 overlying the active region 17, (c) doping of at least a portion of a cap layer 25 with Mg, Zn, and/or another p-type dopant, (d) increasing thickness of the buffer layer 11 arranged over the substrate 10, and (e) increasing thickness of a Si-doped GaN layer underlying the active region.

Regarding enhancement (a) mentioned above, in certain embodiments, the first nitride layer 12 (e.g., unintentionally doped GaN) may be increased by at least about 80%, at least about 120%, at least about 160%, or at least about 200% relative to a conventional unintentionally doped layer (for example, from a conventional thickness of about 5400 Å to a thickness of at least about 10,000 Å or at least about 15,000 Å). Without wishing to be bound by any particular theory, it is believed that increasing thickness of the first nitride layer 12 may decrease defect density in the active region 17, which reduces the probability of non-radiative recombination at defects in the crystal. Since the probability of a non-radiative recombination event increases with temperature, presence of lower defect density is beneficial at elevated emitter operating temperatures to reduce luminous flux droop.

Regarding enhancement (b) mentioned above, in certain embodiments the thickness of the cap layer 25 is increased by at least about 25%, more preferably by at least about 50%, relative to a conventional cap layer (for example, from a conventional thickness of about 240 Å to a thickness of at least about 300 Å or at least about 360 Å). Without wishing to be bound by any particular theory, it is believed that increasing the thickness of the cap layer 25 (also known as an electron blocking layer) may enhance efficacy of electron blocking, which reduces electron overshoot. Since electron overshoot increases at higher temperature, presence of a thicker cap layer 25 may beneficially reduce luminous flux droop at elevated temperatures.

Regarding enhancement (c) mentioned above, doping of at least a portion of the cap layer 25 with Mg, Zn, and/or another p-type dopant may beneficially increase the number of holes available to enhance performance of the adjacent active region 17. Regarding enhancements (d) and (e) mentioned above, increasing thickness of the buffer layer 11 (arranged over a substrate 10) according to improvement (d) and increasing thickness of the second nitride layer (e.g., Si-doped GaN) 14 according to improvement (e) may result in decreased defect density in the active region 17, thereby reducing the probability of non-radiative recombination at defects in the crystal.

In certain embodiments, a LED structure may include one, some, or all of the preceding enhancements (a) to (e) to regions other than the active region as may be beneficial to reduce thermal droop. Such enhancements may be made in conjunction with providing an active region including multiple quantum wells with one or more barrier-well unit interface layers as disclosed herein.

Barrier-well units and active regions of LED structures according to various embodiments will now be described, followed by discussion of such barrier-well units and active regions as incorporated into LED structures.

FIG. 2 is a side cross-sectional schematic view of an active region 117 embodying a multiple quantum well structure that may provide the active region of LED structure 40 illustrated in FIG. 1 in certain embodiments. The active region 117 includes a multiple well structure with multiple InGaN well layers 120-1 to 120-N (where N is a variable of any suitable value) separated by intervening barrier layers 118-1 to 118-N in an alternating fashion, and covered with an additional barrier layer 118-N+1. The barrier layers may generally include GaN, AlGaN, InGaN, or AlInGaN; however, the indium composition of the barrier layers 118-1 to 118-N and 118-N+1 is preferably less than that of the well layers 120-1 to 120-N, so that the barrier layers 118-1 to 118-N and 118-N+1 have a higher bandgap than the well layers 120-1 to 120-N. In certain embodiments, the barrier layers 118-1 to 118-N and 118-N+1 and the well layers 120-1 to 120-N may be undoped (i.e., not intentionally doped with an impurity atom such as silicon or magnesium). In other embodiments, however, it may be desirable to dope the barrier layers 118-1 to 118-N and 118-N+1 with silicon (e.g., at a level of less than $5\times10^{19}$ cm$^{-3}$), particularly if ultraviolet emission is desired.

With continued reference to FIG. 2, within the active region 117, each well layer 120-1 to 120-N is positioned between two barrier layers 118-1 to 118-N and 118-N+1, to form multiple quantum wells 125-1 to 125-N each including a well layer and two barrier layers. Each combination of one barrier layer 118-1 to 118-N and one adjacent well layer 120-1 to 120-N may also be referred to as included in a "barrier-well unit," with multiple barrier-well units 122-1 to 122-N being illustrated in FIG. 2 as being sequentially arranged and covered with an additional barrier layer 118-N+1 to form an active region 117 that includes multiple quantum wells 125-1 to 125-N.

In certain embodiments, an active region as disclosed herein includes multiple quantum wells, which encompass multiple barrier-well units. In certain embodiments, at least one barrier-well unit of an active region includes at least one interface layer in contact with a well and/or barrier layer. In certain embodiments, such interface layers embody thin layers (e.g., preferably less than (or no greater than) 10 Å, less than (or no greater than) 5 Å, less than (or no greater than) 4 Å, or another thickness threshold disclosed herein, and/or preferably a thickness of no greater than about 30% of an adjacent well layer) of various compositions.

Four different barrier-well units 122A-122D are illustrated in FIGS. 3A-3D, with the barrier-well units 122B-122D of FIGS. 3B-3D each including at least one interface layer.

FIG. 3A illustrates a barrier-well unit 122A of a first type that may be provided in a quantity of one or more in conjunction with at least one barrier-well unit of another type (e.g., such as the barrier-well units 122B-122D described herein) in an active region of a LED structure according to certain embodiments. The barrier-well unit 122A includes a barrier layer 118A arranged in contact with a well layer 120A. The well layer 120A preferably has a greater indium composition than the barrier layer 118A, such that the well layer 120A has a larger bandgap than the barrier layer 118A. In certain embodiments, the well layer 120A comprises a thickness in a range of from 15 Å to 40 Å, and the barrier layer 118A comprises a thickness in a range of from 25 Å to 150 Å. In certain embodiments, the barrier layer 118A comprises $Al_aIn_bGa_{1-a-b}N$ wherein 0≤a≤0.50 and 0≤b≤0.10, and the well layer 120A comprises $In_yGa_{1-y}N$ wherein y>0.10 and y>2·b). In certain embodiments, b<0.03. In certain embodiments, a=0 and b=0. In certain embodiments, the well layer 120A comprises InGaN, and wherein indium is present in a range of from 12% to about 20% of metal in the compound. In certain embodiments, the barrier layer 118A comprises GaN.

FIG. 3B illustrates a barrier-well unit 122B of a second type that may be provided in a quantity of one or more, optionally in conjunction with at least one barrier-well unit of another type (such as the barrier units 122A, 122C, and/or 122D described herein), in an active region of a LED structure according to certain embodiments. The barrier-well unit 122B includes a barrier layer 118B arranged in contact with a well layer 120B, with an interface layer 121B arranged in contact with the well layer 120B. In certain embodiments, the materials and thicknesses of the well layer 120B and the barrier layer 118B may be substantially similar to or the same as the well layer 120A and the barrier layer 118A of FIG. 3A. In other embodiments, materials and/or thicknesses of barrier layers and/or well layers may differ among different barrier-well units in the active region of a single LED. In certain embodiments, the interface layer 121B comprises a thickness in a range of no greater than one or more of the following thresholds: 12 Å, 10 Å, 8 Å, 7 Å, 6 Å, 5 Å, 4 Å, 3 Å, 2 Å (optionally bounded by a minimum thickness of about 1 Å, about 2 Å, about 3 Å, about 4 Å, about 5 Å, or about 6 Å), no greater than 30% of the well layer 120B, no greater than 25% of the well layer 120B, no greater than 20% of the well layer 120B, no greater than 15% of the well layer 120B, and no greater than 10% of the well layer 120B.

In certain embodiments, aluminum is present in greater concentration than indium in the interface layer 121B (if indium is present at all), but at a lower concentration than aluminum of a barrier layer of another barrier-well unit (not shown) that may overlie the barrier-well unit 122B. Without being bound by any particular theory of operation, it is believed that the presence of aluminum in the interface layer 121B at an intermediate concentration relative to the well layer 120B and an overlying barrier layer of an adjacent barrier-well unit (not shown) may reduce strain during growth of the overlying barrier layer, thereby enhancing crystal quality. In certain embodiments, the barrier layer 118B comprises $Al_a In_b Ga_{1-a-b}N$ wherein $0 \leq a \leq 0.50$ and $0 \leq b \leq 0.10$, the well layer 120B comprises $In_y Ga_{1-y}N$ wherein $y > 0.10$ and $y > 2 \cdot b$), and the interface layer 121B comprises $Al_z Ga_{1-z}N$, wherein $0 < z \leq 0.10$ (or $0 < z \leq 0.05$). In certain embodiments, z satisfies one of the following thresholds: $0.01 < z < 0.10$, $0.01 < z < 0.08$, $0.01 < z < 0.06$, $0.01 < b < 0.04$, $0.01 < b < 0.03$, and $0.01 < b < 0.02$. In certain embodiments, $0.01 < b < 0.10$. In certain embodiments, a=0 and b=0.

FIG. 3C illustrates a barrier-well unit 122C of a third type that may be provided in a quantity of one or more, optionally in conjunction with at least one barrier-well unit of another type (such as the barrier units 122A, 122B, and/or 122D described herein), in an active region of a LED structure according to certain embodiments. The barrier-well unit 122C includes an interface layer 119C arranged between and in contact with a barrier layer 118C and a well layer 120C. In certain embodiments, the materials and thicknesses of the well layer 120C and the barrier layer 118C may be substantially similar to or the same as the well layer 120A and the barrier layer 118A of FIG. 3A. In certain embodiments, the interface layer 119C comprises a thickness in a range of no greater than one or more of the following thresholds: 12 Å, 10 Å, 8 Å, 7 Å, 6 Å, 5 Å, 4 Å, 3 Å, 2 Å, 30% of the well layer 120C, 25% of the well layer 120C, 20% of the well layer 120C, 15% of the well layer 120C, and 10% of the well layer 120C.

In certain embodiments, indium is present in greater concentration than aluminum in the interface layer 119C (if indium is present at all), but at a lower concentration than indium present in the well layer 120C. Without being bound by any particular theory of operation, it is believed that the presence of indium in the interface layer 119C at an intermediate concentration relative to the well layer 120C and the barrier layer 118C may reduce strain during growth of the well layer 120C, thereby enhancing crystal quality. In certain embodiments, the barrier layer 118C comprises $Al_{a1} In_{b1} Ga_{1-a1-b1}N$ wherein $0 \leq a1 \leq 0.50$ and $0 \leq b1 \leq 0.10$, the interface layer 119C comprises $In_{x1} Ga_{1-x1}N$ wherein $0 < x1 \leq 0.10$ (or $\leq 0.05$) and $x1 < b1$, and the well layer 120C comprises $In_{y1} Ga_{1-y1}N$ wherein $y1 > 0.10$ and $y1 > 2 \cdot b1$. In certain embodiments, x1 satisfies one of the following thresholds: $0.01 < x1 < 0.10$, $0.01 < x1 < 0.08$, $0.01 < x1 < 0.06$, $0.01 < x1 < 0.04$, $0.01 < x1 < 0.03$, and $0.01 < x1 < 0.02$.

FIG. 3D illustrates a barrier-well unit 122D of a fourth type that may be provided in a quantity of one or more, optionally in conjunction with at least one barrier-well unit of another type (such as the barrier units 122A, 122B, and/or 122C described herein), in an active region of a LED structure according to certain embodiments. The barrier-well unit 122D includes a barrier layer 118D, a well layer 120D, a first interface layer 119D arranged between and in contact with the barrier layer 118D and the well layer 120D, and a second interface layer 121D overlying and arranged in contact with the well layer 120D. In certain embodiments, the materials and thicknesses of the well layer 120D and barrier layer 118D may be substantially similar to or the same as the well layer 120A and barrier layer 118A of FIG. 3A. In certain embodiments, the materials and thicknesses of the first interface layer 119D and the second interface layer 121D may be substantially similar to or the same as the interface layer 119C of FIG. 3C and the interface layer 121B of FIG. 3B, respectively. In certain embodiments, the barrier layer 118D comprises $Al_{a2} In_{b2} Ga_{1-a2-b2}N$ wherein $0 \leq a2 \leq 0.50$ and $0 \leq b2 \leq 0.10$, the first interface layer 119D comprises $In_{x2} Ga_{1-x2}N$ wherein $0 < x2 \leq 0.10$ (or $x2 \leq 0.05$, or $0.01 \leq x2 \leq 0.1$) and $x2 < b2$, the well layer 120D comprises $In_{y2} Ga_{1-y2}N$ wherein $y2 > 0.10$ and $y2 > 2 \cdot b2$, and the second interface layer 121D comprises $Al_{z2} Ga_{1-z2}N$ wherein $0 < z2 \leq 0.10$ (or $\leq 0.05$). In certain embodiments, $0 < x2 \leq 0.03$, and $0 < z2 \leq 0.03$. In certain embodiments, $b2 < 0.03$. In certain embodiments, a2=0 and/or b2=0.

Although the barrier-well units 122A-122D illustrated in FIGS. 3A-3D each embody a well layer overlying a barrier layer (e.g., well layers 120A-120D overlying barrier layers 118A-118D, respectively), with interface layers overlying well layers and/or barrier layers, it is to be appreciated that in certain embodiments, a barrier-well unit may include a barrier layer overlying a well layer, and/or one or more interface layers underlying a respective barrier layer or well layer. It is therefore contemplated that, according to certain embodiments, the barrier-well unit 122A of FIG. 3A may encompass a reverse structure including a barrier layer 118A overlying a well layer 120A; the barrier-well unit 122B of FIG. 3B may encompass a reverse structure including a barrier layer 118B overlying a well layer 120B with the interface layer 121B arranged at either (i.e., upper or lower) end of the barrier-well unit 122B; the barrier-well unit 122C of FIG. 3C may encompass a reverse structure including a barrier layer 118C overlying a well layer 120C with an intermediately arranged interface layer 119C; and the barrier-well unit 122D of FIG. 3D may encompass a reverse structure including barrier layer 118D overlying a well layer 120D with an intermediately arranged interface layer 119D, and with the other interface layer arranged at either (i.e., upper or lower) end of the barrier-well unit 122D.

In certain embodiments, an $Al_d In_e Ga_{(1-d-e)}N$ interface layer (wherein e>0 and e≥d, including but not limited to InGaN) may be provided below a well layer of a barrier-well unit. In certain embodiments, an $Al_d In_e Ga_{(1-d-e)}N$ interface layer (wherein e>0 and e≥d, including but not limited to InGaN) may be provided above a well layer of a barrier-well unit. In certain embodiments, $Al_dIn_eGa_{(1-d-e)}N$ interface layers (wherein e>0 and e≥d, including but not limited to InGaN) may be provided above and below a well layer of a barrier-well unit.

In certain embodiments, an $Al_dIn_eGa_{(1-d-e)}N$ interface layer (wherein d>0 and d≥e, including but not limited to AlGaN) may be provided above a well layer of a barrier-well unit. In certain embodiments, an $Al_dIn_eGa_{(1-d-e)}N$ interface layer (wherein d>0 and d≥e, including but not limited to AlGaN) may be provided below a well layer of a barrier-well unit. In certain embodiments, $Al_dIn_eGa_{(1-d-e)}N$ interface layers (wherein d>0 and d≥e, including but not limited to AlGaN) may be provided above and below a well layer of a barrier-well unit.

In certain embodiments, an $Al_dIn_eGa_{(1-d-e)}N$ interface layer (wherein d>0 and d≥e, including but not limited to AlGaN) may be provided below a well layer, and an $Al_dIn_eGa_{(1-d-e)}N$ interface layer (wherein e>0 and e≥d, including but not limited to InGaN) may be provided above a well layer, of a barrier-well unit. In certain embodiments, an $Al_dIn_eGa_{(1-d-e)}N$ interface layer (wherein d>0 and d≥e, including but not limited to AlGaN) may be provided above a well layer, and an $Al_dIn_eGa_{(1-d-e)}N$ interface layer (wherein e>0 and e≥d, including but not limited to InGaN) may be provided below a well layer, of a barrier-well unit.

FIG. 4A is a schematic conduction band diagram for the barrier-well unit 122A of FIG. 3A, showing an abrupt transition in conduction band between the barrier layer 118A and the well layer 120A. Bandgap of the barrier layer 118A is greater than bandgap of the well layer 120A. The dashed line segment to the right of the well layer 120A represents an adjacent barrier layer (e.g., of an adjacent barrier-well unit) not part of the illustrated barrier-well unit 122A. No interface layers are present in the barrier-well unit 122A.

FIGS. 4B1, 4C1, and 4D1 are schematic conduction band diagrams for the barrier-well units of FIGS. 3B, 3C, and 3D, respectively, assuming presence of substantially uniform material composition in the respective interface layer(s). In FIG. 4B1, the conduction band of the well layer 120B is illustrated as a trough between the conduction bands of the barrier layer 118B and the interface layer 121B, with the conduction band (and bandgap) of the interface layer 121B being slightly elevated relative to the conduction band (and bandgap) of the barrier layer 118B (e.g., due to presence of aluminum in the interface layer 121B in certain embodiments). In FIG. 4C1, the conduction band (and bandgap) of the interface layer 119C is intermediately arranged between the conduction bands (and bandgaps) of the barrier layer 118C and the well layer 120C, such as may be attributed to intermediate concentration of indium in the interface layer 119C relative to the barrier layer 118C and the well layer 120C. In FIG. 4D1, the conduction band (and bandgap) of the first interface layer 119D is intermediately arranged between the conduction bands (and bandgaps) of the barrier layer 118D and the well layer 120D, and the conduction band (and bandgap) of the second interface layer 121D is elevated relative to the other layers 118D-120D.

In certain embodiments, interface layers as disclosed herein may comprise a gradient composition that varies with position (e.g., thickness). In certain embodiments, interface layer composition may vary with thickness in a stepwise manner including one or multiple intermediate steps. In other embodiments, interface layer composition may vary with position in a substantially continuous manner.

FIGS. 4B2, 4C2, and 4D2 are schematic conduction band diagrams for the barrier-well units corresponding to FIGS. 3B, 3C, and 3D, respectively, wherein interface layers each include a gradient composition that varies with thickness in a stepwise manner. In FIG. 4B2, the conduction band of the well layer 120B' is illustrated as a trough between the conduction bands of the barrier layer 118B' and the interface layer 121B', with the conduction band of the interface layer 121B' being slightly elevated relative to that of the barrier layer 118B' and including multiple steps corresponding to stepwise variation of composition with respect to thickness of the interface layer 121B'. In FIG. 4C2, the conduction band of the interface layer 119C' is intermediately arranged between the conduction bands of the barrier layer 118C' and the well layer 120C', with the conduction band of the interface layer 119C' including multiple steps corresponding to stepwise variation of composition with respect to thickness of the interface layer 121B'. In FIG. 4D2, the conduction band of the first interface layer 119D' is intermediately arranged between the conduction bands of the barrier layer 118D' and the well layer 120D', the conduction band of the second interface layer 121D' is elevated relative to the other layers 118D'-120D', and each interface layer 119D' and 121D' includes multiple steps corresponding to stepwise variation of composition with respect to thickness of the respective interface layers 119D' and 121D'.

FIGS. 4B3, 4C3, and 4D3 are schematic conduction band diagrams for the barrier-well units corresponding to FIGS. 3B, 3C, and 3D, respectively, wherein interface layers each include a gradient composition that varies with thickness in a substantially continuous manner. Although linear variation in composition is shown, it is to be appreciated that composition may vary in a non-linear fashion, such as according to a curvilinear or exponential function. In FIG. 4B3, the conduction band of the well layer 120B" is illustrated as a trough between the conduction bands of the barrier layer 118B" and the interface layer 121B", with the conduction band of the interface layer 121B" being slightly elevated relative to that of the barrier layer 118B" and including a diagonal line corresponding to substantially continuous variation of composition with respect to thickness of the interface layer 121B". In FIG. 4C3, the conduction band of the interface layer 119C" is intermediately arranged between the conduction bands of the barrier layer 118C" and the well layer 120C", with the conduction band of the interface layer 119C" including a diagonal line corresponding to substantially continuous variation of composition with respect to thickness of the interface layer 121C". In FIG. 4D3, the conduction band of the first interface layer 119D" is intermediately arranged between the conduction bands of the barrier layer 118D" and the well layer 120D", the conduction band of the second interface layer 121D" is elevated relative to the other layers 118D"-120D", and each interface layer 119D" and 121D" includes a diagonal line corresponding to substantially continuous variation of composition with respect to thickness of the respective interface layers 119D" and 121D".

Having described various barrier-well units, active regions of light emitting diodes incorporating multiple sequentially arranged barrier-well units will be described. FIGS. 5A-5D illustrate active regions 117A-117D including two, three, four, and N sequentially arranged barrier-well units, respectively (where N represents a variable of any suitable number), according to various types disclosed herein. In each instance, the multiple barrier-well units may be overlaid with an additional barrier layer 118-N+1.

FIG. 5A illustrates an active region 117A including two barrier-well units 122A-1 or 122B/C/D(')(")-1 and 122A-2 or 122B/C/D(')(")-2 (with the suffixes -1 and -2 corresponding to first and second barrier-well units) overlaid with an additional barrier layer 118-N+1 according to certain embodiments. Reference numeral 122A corresponds generally to the barrier-well units of FIG. 3A and the reverse structures thereof described herein. 122/B/C/D refers to any one of barrier-well units 122B, 122C, and 122D and the reverse structures thereof described herein. Reference numerals 122B-122D correspond to the barrier-well units of FIGS. 3B-3D and 4B1-4D1 and corresponding reverse structures. Suffixes (') and (") as applied to 122/B/C/D refer to the barrier-well units 122B', 122C', 122D', 122B", 122C", and 122D" disclosed in FIGS. 4B2, 4C2, 4D2, 4B3, 4C3, and 4D3, respectively, and corresponding reverse structures.

As used herein, braces { } around an active region including combinations of barrier-well units 122A, 122B, 122C, and 122D are intended to encompass all variants and reverse structures of barrier-well units 122B (i.e., including 122B, 122B', and 122B"), of 122C (i.e., including 122C, 122C' and 122C"), and of 122D (including 122D, 122D', and 122D"), respectively.

Referring back to FIG. 5A, the following combinations of barrier-well units are contemplated according to specific embodiments of the present disclosure: {122A, 122B}, {122A, 122C}, {122A, 122D}, {122B, 122A}, {122B, 122B}, {122B, 122C}, {122B, 122D}, {122C, 122A}, {122C, 122B}, {122C, 122C}, {122C, 122D}, {122D, 122A}, {122D, 122B}, {122D, 122C}, and {122D, 122D}, wherein the combination {122A, 122A} being devoid of any barrier-well unit including at least one interface layer is excluded. In certain embodiments, an active region may include one or more additional barrier-well units, such as may include (but not be limited to) one or more repeats of the foregoing combinations.

Figure 5B:
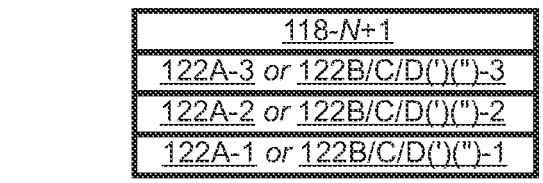
FIG. 5B is a side cross-sectional schematic view of an active region including three barrier-well units of a LED structure according to one embodiment.

FIG. 5B illustrates an active region 117B including three barrier-well units 122A-1 or 122B/C/D(')(")-1, 122A-2 or 122B/C/D(')(")-2, and 122A-3 or 122B/C/D(')(")-3 overlaid with an additional barrier layer 118-N+1 according to certain embodiments. The following combinations of barrier-well units are contemplated according to specific embodiments of the present disclosure: {122A, 122A, 122B}, {122A, 122A, 122C}, {122A, 122A, 122D}, {122A, 122B, 122A}, {122A, 122B, 122B}, {122A, 122B, 122C}, {122A, 122B, 122D}, {122A, 122C, 122A}, {122A, 122C, 122B}, {122A, 122C, 122C}, {122A, 122C, 122D}, {122A, 122D, 122A}, {122A, 122D, 122B}, {122A, 122D, 122C}, {122A, 122D, 122D}, {122B, 122A, 122A}, {122B, 122A, 122B}, {122B, 122A, 122C}, {122B, 122A, 122D}, {122B, 122B, 122A}, {122B, 122B, 122B}, {122B, 122B, 122C}, {122B, 122B, 122D}, {122B, 122C, 122A}, {122B, 122C, 122B}, {122B, 122C, 122C}, {122B, 122C, 122D}, {122B, 122D, 122A}, {122B, 122D, 122B}, {122B, 122D, 122C}, {122B, 122D, 122D}, {122C, 122A, 122A}, {122C, 122A, 122B}, {122C, 122A, 122C}, {122C, 122A, 122D}, {122C, 122B, 122A}, {122C, 122B, 122B}, {122C, 122B, 122C}, {122C, 122B, 122D}, {122C, 122C, 122A}, {122C, 122C, 122B}, {122C, 122C, 122C}, {122C, 122C, 122D}, {122C, 122D, 122A}, {122C, 122D, 122B}, {122C, 122D, 122C}, {122C, 122D, 122D}, {122D, 122A, 122A}, {122D, 122A, 122B}, {122D, 122A, 122C}, {122D, 122A, 122D}, {122D, 122B, 122A}, {122D, 122B, 122B}, {122D, 122B, 122C}, {122D, 122B, 122D}, {122D, 122C, 122A}, {122D, 122C, 122B}, {122D, 122C, 122C}, {122D, 122C, 122D}, {122D, 122D, 122A}, {122D, 122D, 122B}, {122D, 122D, 122C}, and {122D, 122D, 122D}, wherein the combination {122A, 122A, 122A} being devoid of any barrier-well unit including at least one interface layer is excluded. In certain embodiments, an active region may include one or more additional barrier-well units, such as may include (but not be limited to) one or more repeats of the foregoing combinations, and/or one or more of such barrier-well units in combination with one or more barrier-well units disclosed in the preceding paragraph.

Figure 5C:
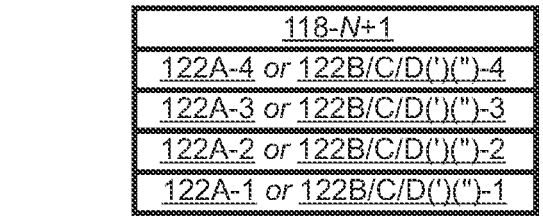
FIG. 5C is a side cross-sectional schematic view of an active region including four barrier-well units of a LED structure according to one embodiment.

FIG. 5C illustrates an active region 117C including four barrier-well units 122A-1 or 122B/C/D(')(")-1, 122A-2 or 122B/C/D(')(")-2, 122A-3 or 122B/C/D(')(")-3, and 122A-4 or 122B/C/D(')(")-4 overlaid with an additional barrier layer 118-N+1 according to certain embodiments. The following combinations of barrier-well units are contemplated according to specific embodiments of the present disclosure: {122A, 122A, 122A, 122B}, {122A, 122A, 122A, 122C}, {122A, 122A, 122A, 122D}, {122A, 122A, 122B, 122A}, {122A, 122A, 122B, 122B}, {122A, 122A, 122B, 122C}, {122A, 122A, 122B, 122D}, {122A, 122A, 122C, 122A}, {122A, 122A, 122C, 122B}, {122A, 122A, 122C, 122C}, {122A, 122A, 122C, 122D}, {122A, 122A, 122D, 122A}, {122A, 122A, 122D, 122B}, {122A, 122A, 122D, 122C}, {122A, 122A, 122D, 122D}, {122A, 122B, 122A, 122A}, {122A, 122B, 122A, 122B}, {122A, 122B, 122A, 122C}, {122A, 122B, 122A, 122D}, {122A, 122B, 122B, 122A}, {122A, 122B, 122B, 122B}, {122A, 122B, 122B, 122C}, {122A, 122B, 122B, 122D}, {122A, 122B, 122C, 122A}, {122A, 122B, 122C, 122B}, {122A, 122B, 122C, 122C}, {122A, 122B, 122C, 122D}, {122A, 122B, 122D, 122A}, {122A, 122B, 122D, 122B}, {122A, 122B, 122D, 122C}, {122A, 122B, 122D, 122D}, {122A, 122C, 122A, 122A}, {122A, 122C, 122A, 122B}, {122A, 122C, 122A, 122C}, {122A, 122C, 122A, 122D}, {122A, 122C, 122B, 122A}, {122A, 122C, 122B, 122B}, {122A, 122C, 122B, 122C}, {122A, 122C, 122B, 122D}, {122A, 122C, 122C, 122A}, {122A, 122C, 122C, 122B}, {122A, 122C, 122C, 122C}, {122A, 122C, 122C, 122D}, {122A, 122C, 122D, 122A}, {122A, 122C, 122D, 122B}, {122A, 122C, 122D, 122C}, {122A, 122C, 122D, 122D}, {122A, 122D, 122A, 122A}, {122A, 122D, 122A, 122B}, {122A, 122D, 122A, 122C}, {122A, 122D, 122A, 122D}, {122A, 122D, 122B, 122A}, {122A, 122D, 122B, 122B}, {122A, 122D, 122B, 122C}, {122A, 122D, 122B, 122D}, {122A, 122D, 122C, 122A}, {122A, 122D, 122C, 122B}, {122A, 122D, 122C, 122C}, {122A, 122D, 122C, 122D}, {122A, 122D, 122D, 122A}, {122A, 122D, 122D, 122B}, {122A, 122D, 122D, 122C}, {122A, 122D, 122D, 122D}, {122B, 122A, 122A, 122A}, {122B, 122A, 122A, 122B}, {122B, 122A, 122A, 122C}, {122B, 122A, 122A, 122D}, {122B, 122A, 122B, 122A}, {122B, 122A, 122B, 122B}, {122B, 122A, 122B, 122C}, {122B, 122A, 122B, 122D}, {122B, 122A, 122C, 122A}, {122B, 122A, 122C, 122B}, {122B, 122A, 122C, 122C}, {122B, 122A, 122C, 122D}, {122B, 122A, 122D, 122A}, {122B, 122A, 122D, 122B}, {122B, 122A, 122D, 122C}, {122B, 122A, 122D, 122D}, {122B, 122B, 122A, 122A}, {122B, 122B, 122A, 122B}, {122B, 122B, 122A, 122C}, {122B, 122B, 122A, 122D}, {122B, 122B, 122B, 122A}, {122B, 122B, 122B, 122B}, {122B, 122B, 122B, 122C}, {122B, 122B, 122B, 122D}, {122B, 122B, 122C, 122A}, {122B, 122B, 122C, 122B}, {122B, 122B, 122C, 122C}, {122B, 122B, 122C, 122D}, {122B, 122B, 122D, 122A}, {122B, 122B, 122D, 122B}, {122B, 122B, 122D, 122C}, {122B, 122B, 122D, 122D}, {122B, 122C, 122A, 122A}, {122B, 122C, 122A, 122B}, {122B, 122C, 122A, 122C}, {122B, 122C, 122A, 122D}, {122B, 122C, 122B, 122A}, {122B, 122C, 122B, 122B}, {122B, 122C, 122B, 122C}, {122B, 122C, 122B, 122D}, {122B, 122C, 122C, 122A}, {122B, 122C, 122C, 122B}, {122B, 122C, 122C, 122C},
{122B, 122C, 122C, 122D}, {122B, 122C, 122D, 122A},
{122B, 122C, 122D, 122B}, {122B, 122C, 122D, 122C},
{122B, 122C, 122D, 122D}, {122B, 122D, 122A, 122A},
{122B, 122D, 122A, 122B}, {122B, 122D, 122A, 122C},
{122B, 122D, 122A, 122D}, {122B, 122D, 122B, 122A},
{122B, 122D, 122B, 122B}, {122B, 122D, 122B, 122C},
{122B, 122D, 122B, 122D}, {122B, 122D, 122C, 122A},
{122B, 122D, 122C, 122B}, {122B, 122D, 122C, 122C},
{122B, 122D, 122C, 122D}, {122B, 122D, 122D, 122A},
{122B, 122D, 122D, 122B}, {122B, 122D, 122D, 122C},
{122B, 122D, 122D, 122D}, {122C, 122A, 122A, 122A},
{122C, 122A, 122A, 122B}, {122C, 122A, 122A, 122C},
{122C, 122A, 122A, 122D}, {122C, 122A, 122B, 122A},
{122C, 122A, 122B, 122B}, {122C, 122A, 122B, 122C},
{122C, 122A, 122B, 122D}, {122C, 122A, 122C, 122A},
{122C, 122A, 122C, 122B}, {122C, 122A, 122C, 122C},
{122C, 122A, 122C, 122D}, {122C, 122A, 122D, 122A},
{122C, 122A, 122D, 122B}, {122C, 122A, 122D, 122C},
{122C, 122A, 122D, 122D}, {122C, 122B, 122A, 122A},
{122C, 122B, 122A, 122B}, {122C, 122B, 122A, 122C},
{122C, 122B, 122A, 122D}, {122C, 122B, 122B, 122A},
{122C, 122B, 122B, 122B}, {122C, 122B, 122B, 122C},
{122C, 122B, 122B, 122D}, {122C, 122B, 122C, 122A},
{122C, 122B, 122C, 122B}, {122C, 122B, 122C, 122C},
{122C, 122B, 122C, 122D}, {122C, 122B, 122D, 122A},
{122C, 122B, 122D, 122B}, {122C, 122B, 122D, 122C},
{122C, 122B, 122D, 122D}, {122C, 122C, 122A, 122A},
{122C, 122C, 122A, 122B}, {122C, 122C, 122A, 122C},
{122C, 122C, 122A, 122D}, {122C, 122C, 122B, 122A},
{122C, 122C, 122B, 122B}, {122C, 122C, 122B, 122C},
{122C, 122C, 122B, 122D}, {122C, 122C, 122C, 122A},
{122C, 122C, 122C, 122B}, {122C, 122C, 122C, 122C},
{122C, 122C, 122C, 122D}, {122C, 122C, 122D, 122A},
{122C, 122C, 122D, 122B}, {122C, 122C, 122D, 122C},
{122C, 122C, 122D, 122D}, {122C, 122D, 122A, 122A},
{122C, 122D, 122A, 122B}, {122C, 122D, 122A, 122C},
{122C, 122D, 122A, 122D}, {122C, 122D, 122B, 122A},
{122C, 122D, 122B, 122B}, {122C, 122D, 122B, 122C},
{122C, 122D, 122B, 122D}, {122C, 122D, 122C, 122A},
{122C, 122D, 122C, 122B}, {122C, 122D, 122C, 122C},
{122C, 122D, 122C, 122D}, {122C, 122D, 122D, 122A},
{122C, 122D, 122D, 122B}, {122C, 122D, 122D, 122C},
{122C, 122D, 122D, 122D}, {122D, 122A, 122A, 122A},
{122D, 122A, 122A, 122B}, {122D, 122A, 122A, 122C},
{122D, 122A, 122A, 122D}, {122D, 122A, 122B, 122A},
{122D, 122A, 122B, 122B}, {122D, 122A, 122B, 122C},
{122D, 122A, 122B, 122D}, {122D, 122A, 122C, 122A},
{122D, 122A, 122C, 122B}, {122D, 122A, 122C, 122C},
{122D, 122A, 122C, 122D}, {122D, 122A, 122D, 122A},
{122D, 122A, 122D, 122B}, {122D, 122A, 122D, 122C},
{122D, 122A, 122D, 122D}, {122D, 122B, 122A, 122A},
{122D, 122B, 122A, 122B}, {122D, 122B, 122A, 122C},
{122D, 122B, 122A, 122D}, {122D, 122B, 122B, 122A},
{122D, 122B, 122B, 122B}, {122D, 122B, 122B, 122C},
{122D, 122B, 122B, 122D}, {122D, 122B, 122C, 122A},
{122D, 122B, 122C, 122B}, {122D, 122B, 122C, 122C},
{122D, 122B, 122C, 122D}, {122D, 122B, 122D, 122A},
{122D, 122B, 122D, 122B}, {122D, 122B, 122D, 122C},
{122D, 122B, 122D, 122D}, {122D, 122C, 122A, 122A},
{122D, 122C, 122A, 122B}, {122D, 122C, 122A, 122C},
{122D, 122C, 122A, 122D}, {122D, 122C, 122B, 122A},
{122D, 122C, 122B, 122B}, {122D, 122C, 122B, 122C},
{122D, 122C, 122B, 122D}, {122D, 122C, 122C, 122A},
{122D, 122C, 122C, 122B}, {122D, 122C, 122C, 122C},
{122D, 122C, 122C, 122D}, {122D, 122C, 122D, 122A},
{122D, 122C, 122D, 122B}, {122D, 122C, 122D, 122C},
{122D, 122C, 122D, 122D}, {122D, 122D, 122A, 122A},
{122D, 122D, 122A, 122B}, {122D, 122D, 122A, 122C},
{122D, 122D, 122A, 122D}, {122D, 122D, 122B, 122A},
{122D, 122D, 122B, 122B}, {122D, 122D, 122B, 122C},
{122D, 122D, 122B, 122D}, {122D, 122D, 122C, 122A},
{122D, 122D, 122C, 122B}, {122D, 122D, 122C, 122C},
{122D, 122D, 122C, 122D}, {122D, 122D, 122D, 122A},
{122D, 122D, 122D, 122B}, {122D, 122D, 122D, 122C},
and {122D, 122D, 122D, 122D}, wherein the combination {122A, 122A, 122A, 122A} being devoid of any barrier-well unit including at least one interface layer is excluded. In certain embodiments, an active region may include one or more additional barrier-well units, such as may include (but not be limited to) one or more repeats of the foregoing combinations, and/or one or more of such barrier-well units in combination with one or more barrier-well units disclosed in the preceding two paragraphs.

Figure 5D:
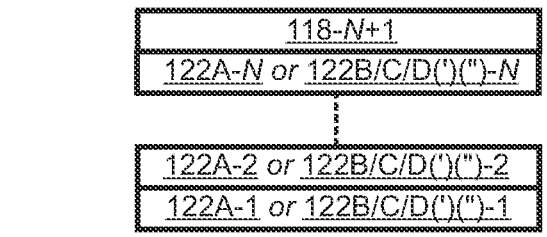
FIG. 5D is a side cross-sectional schematic view of an active region including N barrier-well units of a LED structure according to one embodiment.

FIG. 5D illustrates an active region 117D including multiple barrier-well units 122A-1 or 122B/C/D(')(")-1, 122A-2 or 122B/C/D(')(")-2, and 122A-N or 122B/C/D(')(")-N overlaid with an additional barrier layer 118-N+1 according to certain embodiments. It is to be appreciated that N represents a variable corresponding to any suitable number.

Although active regions 117A-117D are illustrated in FIGS. 5A-5D as consisting solely of barrier-well units and optional additional barrier layers, it is to be appreciated that in certain embodiments one or more layers (e.g., including superlattices) of various types and compositions may be present with in an active region of a light emitting diode.

In certain embodiments, an active region of a light emitting diode includes from three to twelve barrier-well units (although certain embodiments may include additional or fewer barrier-well units). In certain embodiments, an active region may be asymmetric with respect to thickness. In certain embodiments, at least one barrier well unit includes, but less than all barrier-well units include, an interface layer within an active region of a LED. In certain embodiments, at least one barrier well unit includes, but less than all barrier-well units include, an interface layer with an aluminum composition intermediate to aluminum compositions of a barrier layer and well layer contacting the interface layer, wherein aluminum may be optionally absent from the well layer. In certain embodiments, at least one barrier well unit includes an interface layer with an indium composition intermediate to indium compositions of a barrier layer and well layer contacting the interface layer, wherein indium may be optionally absent from the barrier layer. In certain embodiments, a barrier-well unit of a first type including at least one interface layer is present in a number that exceeds a number of barrier-well units of a second type (optionally including at least one interface layer). In certain embodiments, at least one, at least two, at least three, or at least four barrier-well units present within an active region of a LED comprise an $Al_y In_z Ga_{1-y-z}N$ interface layer. In certain embodiments, no more than 50%, no more than 60%, no more than 70%, no more than 80%, or no more than 90% of barrier-well units present within an active region of a LED comprise an $Al_y In_z Ga_{1-y-z}N$ interface layer. In certain embodiments, $y>0$ and $y \geq z$, or $z>0$ and $z \geq y$.

In certain embodiments, a barrier-well unit of a first type including multiple interface layers is present in a number that exceeds a number of barrier-well units of a second type that includes one interface layer or is being devoid of any interface layers.

In certain embodiments, a multiple quantum well active region of a LED includes multiple barrier-well units wherein at least one barrier-well unit includes an aluminum-containing Group III nitride interface layer, wherein aluminum is present at a low but non-zero value (e.g., less than about 10%, less than about 5%, greater than about 0.1%, and/or greater than about 1% of metal present in the Group III nitride material), and indium is optionally present at a concentration of no greater than one-fourth, one fifth, one-eighth, or one-tenth the concentration of aluminum in such layer. In certain embodiments, a multiple quantum well active region of a LED includes multiple barrier-well units wherein at least one barrier-well unit includes an indium-containing Group III nitride interface layer, wherein indium is present at a low but non-zero value (e.g., less than about 10%, less than about 5%, greater than about 0.1%, and/or greater than about 1% of metal present in the III nitride material), and aluminum is optionally present at a concentration of no greater than one-fourth, one fifth, one-eighth, or one-tenth the concentration of indium in such layer.

In certain embodiments, multiple barrier-well units of different types, each including at least one interface layer, may be provided in a single LED. In certain embodiments, different barrier-well units present in a single active region may comprise substantially the same thicknesses and compositions of barrier layers and well layers but differ only in presence or absence of one or more interface layers. In certain embodiments, interface layers having low but non-zero concentrations of indium are present in greater number than interface layers having low but non-zero concentrations of aluminum within an active region of a LED.

In certain embodiments, a LED includes at least one aluminum-containing interface layer, wherein aluminum is present at a relatively low concentration (e.g., less than about 10%, less than about 5%, greater than about 0.1%, and/or greater than about 1% of metal present in the Group III nitride material).

In certain embodiments, a LED comprises: an active region comprising a plurality of sequentially arranged barrier-well units; wherein each barrier-well unit comprises an $Al_aIn_bGa_{1-a-b}N$ barrier layer and an $In_cGa_{1-c}N$ well layer; and wherein at least one barrier-well unit, but fewer than all barrier-well units, of the plurality of sequentially arranged barrier-well units, additionally comprises an $Al_yIn_zGa_{1-y-z}N$ interface layer (wherein y>0 and wherein y≥z). In certain embodiments, the LED comprises at least one (or at least two, or at least three, or at least four) of the following features (i) to (vi): (i) c>0.10 and c>2·b; (ii) 0≤a≤0.50 and 0≤b≤0.10; (iii) y≤0.10; (iv) y≥4·z; (v) z=0; and (vi) y≤0.05 and 0≤z≤0.01. In certain embodiments, in the at least one barrier-well unit, the $Al_yIn_zGa_{1-y-z}N$ interface layer is in contact with the $In_cGa_{1-c}N$ well layer and is in contact with a barrier layer of an adjacent barrier-well unit of the plurality of sequentially arranged barrier-well units. In certain embodiments, the $Al_yIn_zGa_{1-y-z}N$ interface layer comprises a thickness of no greater than 10 Å (or no greater than 4 Å) and/or the $Al_yIn_zGa_{1-y-z}N$ interface layer comprises a thickness of no greater than about 30% (or no greater than 25%, or no greater than 20%) of the $In_cGa_{1-c}N$ well layer. In certain embodiments, no more than 50%, no more than 60%, no more than 70%, no more than 80%, or no more than 90% of barrier-well units present within an active region of a LED comprise an $Al_yIn_zGa_{1-y-z}N$ interface layer (wherein y>0 and wherein y≥z). In certain embodiments, at least one barrier-well unit comprises an indium-containing $Al_wIn_xGa_{1-w-x}N$ interface layer (e.g., preferably wherein 0<In≤0.1 (or 0<In≤0.05), and x>4·w), which in certain embodiments may be provided between and in contact with the $Al_aIn_bGa_{1-a-b}N$ barrier layer and the $In_cGa_{1-c}N$ well layer. Other configurations of interface layers, barrier layers, and well layers as disclosed herein may be used. In certain embodiments, various barrier-well units may include barrier layers of substantially the same thickness and/or material (e.g., GaN) and well layers of substantially the same thickness and/or material (e.g., InGaN). In certain embodiments, each well layer comprises a thickness in a range of from 15 Å to 40 Å and/or each barrier layer comprises a thickness in a range of from 25 Å to 150 Å.

In certain embodiments, a light emitting diode comprises an active region comprising a plurality of sequentially arranged barrier-well units; wherein the plurality of sequentially arranged barrier-well units comprises at least one barrier-well unit of a first type, and each barrier-well unit of the first type comprises an $Al_{a1}In_{b1}Ga_{1-a1-b1}N$ barrier layer, an $In_{c1}Ga_{1-c1}N$ well layer, an $Al_{w1}In_{x1}Ga_{1-w1-x1}N$ interface layer (wherein x1>0 and wherein x1≥w1), and an $Al_{y1}In_{z1}Ga_{1-y1-z1}N$ interface layer (wherein y1>0 and wherein y1≥z1). In certain embodiments, the LED comprises at least one (or multiple) of the following features (i) to (vi): (i) c>0.10 and c>2·b; (ii) 0≤a≤0.50 and 0≤b≤0.10; (iii) y1≤0.10; (iv) y1≥4·z1; (v) z1=0; and (vi) y1≤0.05 and 0≤z1≤0.01. In certain embodiments, one or both of the $Al_{w1}In_{x1}Ga_{1-w1-x1}N$ interface layer and the $Al_{y1}In_{z1}Ga_{1-y1-z1}N$ interface layer comprises a thickness of no greater than 10 Å (or no greater than 4 Å) and/or a thickness of no greater than about 30% (or no greater than about 25%, or no greater than about 20%) of the $In_{c1}Ga_{1-c1}N$ well layer. In certain embodiments, in the at least one barrier-well unit of a first type, the $Al_{w1}In_{x1}Ga_{1-w1-x1}N$ interface layer is arranged between and in contact with the $Al_{a1}In_{b1}Ga_{1-a1-b1}N$ barrier layer and the $In_{c1}Ga_{1-c1}N$ well layer, and the $Al_{y1}In_{z1}Ga_{1-y1-z1}N$ interface layer is arranged in contact with the $In_{c1}Ga_{1-c1}N$ well layer. Other configurations of interface layers, barrier layers, and well layers as disclosed herein may be used. In certain embodiments, the LED comprises at least one barrier-well unit of a second type, and each barrier-well unit of the second type comprises an $Al_{a2}In_{b2}Ga_{1-a2-b2}N$ barrier layer, an $In_{c2}Ga_{1-c2}N$ well layer, and an $Al_{y2}In_{z2}Ga_{1-y2-z2}N$ interface layer (wherein y2>0 and wherein y2≥z2). In certain embodiments, the at least one barrier-well unit of the first type comprises a plurality of barrier-well units of the first type, and a number of barrier-well units of the first type exceeds a number of barrier-well units of the second type present in the light emitting diode. Other configurations of interface layers, barrier layers, and well layers as disclosed herein may be used. In certain embodiments, various barrier-well units may include barrier layers of substantially the same thickness and/or material (e.g., GaN) and well layers of substantially the same thickness and/or material (e.g., InGaN). In certain embodiments, each well layer comprises a thickness in a range of from 15 Å to 40 Å and/or each barrier layer comprises a thickness in a range of from 25 Å to 150 Å.

In certain embodiments, a light emitting diode comprises an active region comprising a plurality of sequentially arranged barrier-well units; wherein the plurality of sequentially arranged barrier-well units comprises at least one barrier-well unit of a first type, and each barrier-well unit of the first type comprises a Group III nitride barrier layer comprising a first bandgap, a Group III nitride well layer comprising a second bandgap, a first Group III nitride interface layer comprising a third bandgap, and a second Group III nitride interface layer comprising a fourth bandgap; and wherein the third bandgap is greater than the second bandgap, the first bandgap is greater than the third bandgap, and the fourth bandgap is greater than the first bandgap. In certain embodiments, the Group III nitride barrier layer comprises an $Al_{a1}In_{b1}Ga_{1-a1-b1}N$ barrier layer, the Group III nitride well layer comprises an $In_{c1}Ga_{1-c1}N$ well layer, the first Group III nitride interface layer comprises an $Al_wIn_xGa_{1-w-x}N$ interface layer (wherein x>0 and wherein x≥w), and the second Group III nitride interface layer comprises an $Al_{y1}In_{z1}Ga_{1-y1-z1}N$ interface layer (wherein y1>0 and wherein y1≥z1). In certain embodiments, one or both of the first Group III nitride interface layer and the second Group III nitride interface layer comprises a thickness of no greater than 10 Å (or no greater than 4 Å) and/or a thickness of no greater than about 30% (or no greater than about 25%, or no greater than about 20%) of the Group III nitride well layer. In certain embodiments, in the at least one barrier-well unit of the first type, the first Group III nitride interface layer is arranged between and in contact with the Group III nitride barrier layer and the Group III nitride well layer, and the second Group III nitride interface layer is arranged in contact with the Group III nitride well layer. Other configurations of interface layers, barrier layers, and well layers as disclosed herein may be used. In certain embodiments, the plurality of sequentially arranged barrier-well units comprises at least one barrier-well unit of a second type, and each barrier-well unit of the second type comprises a second Group III nitride barrier layer comprising a fifth bandgap, a second Group III nitride well layer comprising a sixth bandgap, and a third Group III nitride interface layer comprising a seventh bandgap; wherein the fifth bandgap is greater than the sixth bandgap, and the seventh bandgap is greater than the fifth bandgap. In certain embodiments, the second Group III nitride barrier layer comprises an $Al_{a2}In_{b2}Ga_{1-a2-b2}N$ barrier layer, the second Group III nitride well layer comprises an $In_{c2}Ga_{1-c2}N$ well layer, and the third Group III nitride interface layer comprises $Al_{y2}In_{z2}Ga_{1-y2-z2}N$ interface layer (wherein y2>0 and wherein y2≥z2). In certain embodiments, the at least one barrier-well unit of the first type comprises a plurality of barrier-well units of the first type, and a number of barrier-well units of the first type exceeds a number of barrier-well units of the second type present in the LED. In certain embodiments, various barrier-well units may include barrier layers of substantially the same thickness and/or material (e.g., GaN) and well layers of substantially the same thickness and/or material (e.g., InGaN). In certain embodiments, each well layer comprises a thickness in a range of from 15 Å to 40 Å and/or each barrier layer comprises a thickness in a range of from 25 Å to 150 Å.

In certain embodiments, a light emitting diode comprises an active region comprising a plurality of sequentially arranged barrier-well units; wherein each barrier-well unit comprises a Group III nitride barrier layer comprising a first bandgap and a Group III nitride well layer comprising a second bandgap; wherein at least one barrier-well unit, but fewer than all barrier-well units, of the plurality of sequentially arranged barrier-well units, additionally comprises a first Group III nitride interface layer comprising a third bandgap; and wherein the first bandgap is greater than the second bandgap, and the third bandgap is greater than the first bandgap. In certain embodiments, no more than 50%, no more than 60%, no more than 70%, no more than 80%, or no more than 90% of barrier-well units present within an active region of a LED comprise an $Al_yIn_zGa_{1-y-z}N$ interface layer (wherein y>0 and wherein y≥z). In certain embodiments, Group III nitride well layer comprises an $In_{c1}Ga_{1-c1}N$ well layer, and the first Group III nitride interface layer comprises an $Al_yIn_zGa_{1-y-z}N$ interface layer (wherein y>0 and wherein y≥z. In certain embodiments, the first Group III nitride interface layer comprises a thickness of no greater than 10 Å (or no greater than 4 Å) and/or a thickness of no greater than about 30% (or no greater than about 25%, or no greater than about 20%) of the Group III nitride well layer. In certain embodiments, in the at least one barrier-well unit, the first Group III nitride interface layer is in contact with the Group III nitride well layer and is in contact with a Group III nitride barrier layer of an adjacent barrier-well unit of the plurality of sequentially arranged barrier-well units. In certain embodiments, at least one barrier-well unit comprises a second Group III nitride interface layer comprising a fourth bandgap, wherein the fourth bandgap is greater than the second bandgap, and wherein the first bandgap is greater than the fourth bandgap. In certain embodiments, for the at least one barrier-well unit that comprises the second Group III nitride interface layer, the second Group III nitride interface layer is provided between and in contact with the Group III nitride barrier layer and the Group III nitride well layer. Other configurations of interface layers, barrier layers, and well layers as disclosed herein may be used. In certain embodiments, various barrier-well units may include barrier layers of substantially the same thickness and/or material (e.g., GaN) and well layers of substantially the same thickness and/or material (e.g., InGaN). In certain embodiments, each well layer comprises a thickness in a range of from 15 Å to 40 Å and/or each barrier layer comprises a thickness in a range of from 25 Å to 150 Å.

In certain embodiments, a light emitting diode comprises an active region comprising a plurality of sequentially arranged barrier-well units; wherein each barrier-well unit of the first type comprises an $Al_{a1}In_{b1}Ga_{1-a1-b1}N$ barrier layer (wherein at least one of the following is true: a1<0.2 and b1=0), an $In_{c1}Ga_{1-c1}N$ well layer, and an $Al_{w1}In_{x1}Ga_{1-w1-x1}N$ interface layer (wherein 0<x1<0.05, w1+x1<1, and b1<x1<c1); and wherein the $Al_{w1}In_{x1}Ga_{1-w1-x1}N$ interface layer comprises a thickness of no greater than about 30% (or no greater than about 25%, or no greater than about 20%) of a thickness of the $In_{c1}Ga_{1-c1}N$ well layer. In certain embodiments, a LED comprises at least one (or multiple) of the following features (i) to (iv): (i) c>0.10 and c>2·b; (ii) 0≤a≤0.50 and 0≤b≤0.10; (iii) x1≥4·w1; and (iv) 0≤w1≤0.01. In certain embodiments, the $Al_{w1}In_{x1}Ga_{1-w1-x1}N$ interface layer comprises a thickness of no greater than 10 Å (or no greater than 4 Å). In certain embodiments, in the at least one barrier-well unit of a first type, the $Al_{w1}In_{x1}Ga_{1-w1-x1}N$ interface layer is arranged between and in contact with the $Al_{a1}In_{b1}Ga_{1-a1-b1}N$ barrier layer and the $In_{c1}Ga_{1-c1}N$ well layer. In certain embodiments, at least one barrier-well unit of the plurality of sequentially arranged barrier-well units comprises an $Al_yIn_zGa_{1-y-z}N$ interface layer (wherein y>0 and wherein y≥z). In certain embodiments, 0<z≤0.01. In certain embodiments, in the at least one barrier-well unit, the $Al_yIn_zGa_{1-y-z}N$ interface layer is in contact with the $In_cGa_{1-c}N$ well layer and is in contact with an $Al_{a1}In_{b1}Ga_{1-a1-b1}N$ barrier layer of an adjacent barrier-well unit of the plurality of sequentially arranged barrier-well units. In certain embodiments, the plurality of sequentially arranged barrier-well units comprises at least one barrier-well unit of a second type, and each barrier-well unit of the second type comprises an $Al_{a2}In_{b2}Ga_{1-a2-b2}N$ barrier layer, an $In_{c2}Ga_{1-c2}N$ well layer, an $Al_{y2}In_{z2}Ga_{1-y2-z2}N$ interface layer (wherein y2>0 and wherein y2≥z2), and an $Al_{w2}In_{x2}Ga_{1-w2-x2}N$ interface layer (wherein w2>0 and wherein w2≥x2). In certain embodiments, in the at least one barrier-well unit of the second type, the $Al_{w2}In_{x2}Ga_{1-w2-x2}N$ interface layer is arranged between and in contact with the $Al_{a2}In_{b2}Ga_{1-a2-b2}N$ barrier layer and the $In_{c2}Ga_{1-c2}N$ well layer, and the second Group III nitride interface layer is arranged in contact with the $In_{c2}Ga_{1-c2}N$ well layer. In certain embodiments, the at least one barrier-well unit of the first type comprises a plurality of barrier-well units of the first type, and a number of barrier-well units of the first type exceeds a number of barrier-well units of the second type present in the light emitting diode. Other configurations of interface layers, barrier layers, and well layers as disclosed herein may be used. In certain embodiments, various barrier-well units may include barrier layers of substantially the same thickness and/or material (e.g., GaN) and well layers of substantially the same thickness and/or material (e.g., InGaN). In certain embodiments, each well layer comprises a thickness in a range of from 15 Å to 40 Å and/or each barrier layer comprises a thickness in a range of from 25 Å to 150 Å.

In one embodiment, a light emitting diode comprises an active region comprising a plurality of sequentially arranged barrier-well units; wherein each barrier-well unit comprises an $Al_aIn_bGa_{1-a-b}N$ barrier layer (wherein 0≤a≤0.50 and 0≤b≤0.10) and an $In_yGa_{1-y}N$ well layer (wherein y>0.10 and y>2·b) overlying the $Al_aIn_bGa_{1-a-b}N$ barrier layer; and wherein for at least one barrier-well unit, but for fewer than all barrier-well units, of the plurality of sequentially arranged barrier-well units, the respective barrier-well unit additionally comprises an $Al_zGa_{1-z}N$ interface layer (wherein 0<z≤0.10, or wherein 0<z≤0.05 in certain embodiments) contacting the $In_yGa_{1-y}N$ well layer of the respective barrier-well unit and contacting the $Al_aIn_bGa_{1-a-b}N$ barrier layer of an adjacent barrier-well unit of the plurality of sequentially arranged barrier-well units. In certain embodiments, the $Al_zGa_{1-z}N$ interface layer may further include a small amount of In (e.g., at a concentration not exceeding one-fourth, one-eighth, or one tenth, the Al concentration therein). In certain embodiments, the $Al_zGa_{1-z}N$ interface layer comprises a thickness of no greater than about 30% (or no greater than about 25%, or no greater than about 20%) of the $In_yGa_{1-y}N$ well layer, and/or a thickness of no greater than 10 Å (or no greater than 4 Å in certain embodiments). In certain embodiments, for at least one barrier-well unit of the plurality of sequentially arranged barrier-well units, an $In_xGa_{1-x}N$ interface layer (wherein 0<x≤0.05 and x<b) is provided in contact with the $Al_aIn_bGa_{1-a-b}N$ barrier layer and in contact with the $In_yGa_{1-y}N$ well layer. In certain embodiments, the $In_xGa_{1-x}N$ may further include a small amount of Al (e.g., at a concentration not exceeding one-fourth, one-eighth, or one tenth, the In concentration therein). In certain embodiments, b<0.03. In certain embodiments, a=0 and b=0. In certain embodiments, the plurality of sequentially arranged barrier-well units comprises from three to twelve barrier-well units. In certain embodiments, at least one of the $Al_aIn_bGa_{1-a-b}N$ barrier layer and the $In_yGa_{1-y}N$ well layer is undoped. In certain embodiments, at least one of the $Al_aIn_bGa_{1-a-b}N$ barrier layer and the $In_yGa_{1-y}N$ well layer comprises a graded composition, with composition varying in a stepwise or substantially continuous manner. In certain embodiments, the active region may be arranged between (but not necessarily directly contacting) a p-type Group III nitride based semiconductor layer and a n-type Group III nitride based semiconductor layer of the LED.

In one embodiment, a light emitting diode comprises an active region comprising a plurality of sequentially arranged barrier-well units including: at least one barrier-well unit of a first type, wherein each barrier-well unit of the first type comprises an $Al_{a1}In_{b1}Ga_{1-a1-b1}N$ barrier layer (wherein 0≤a1≤0.50 and 0≤b1≤0.10), an $In_{x1}Ga_{1-x1}N$ interface layer (wherein 0<x1≤0.05 and x1<b1) contacting the $Al_{a1}In_{b1}Ga_{1-a1-b1}N$ barrier layer, and an $In_{y1}Ga_{1-y1}N$ well layer (wherein y1>0.10 and y1>2·b1) contacting the $In_{x1}Ga_{1-x1}N$ interface layer; and at least one barrier-well unit of a second type, wherein each barrier-well unit of the second type comprises an $Al_{a2}In_{b2}Ga_{1-a2-b2}N$ barrier layer (wherein 0≤a2≤0.50 and 0≤b2≤0.10), an $In_{x2}Ga_{1-x2}N$ interface layer (wherein 0<x2≤0.05 and x2<b2) contacting the $Al_{a2}In_{b2}Ga_{1-a2-b2}N$ barrier layer, an $In_{y2}Ga_{1-y2}N$ well layer (wherein y2>0.10 and y2>2·b2) contacting the $In_{x2}Ga_{1-x2}N$ interface layer, and an $Al_{z2}Ga_{1-z2}N$ interface layer (wherein 0<z2≤0.05) contacting the $In_{y2}Ga_{1-y2}N$ well layer. In certain embodiments, the $In_{x1}Ga_{1-x1}N$ interface layer comprises a thickness of no greater than 10 Å (or no greater than 4 Å) and/or a thickness of no greater than about 30% of the $In_{y1}Ga_{1-y1}N$ well layer; the $In_{x2}Ga_{1-x2}N$ interface layer comprises a thickness of no greater than 10 Å (or no greater than 4 Å) and/or a thickness of no greater than about 30% of the $In_{y2}Ga_{1-y2}N$ well layer; and the $Al_{z2}Ga_{1-z2}N$ interface layer comprises a thickness of no greater than 10 Å (or no greater than 4 Å) and/or a thickness of no greater than about 30% of the $In_{y2}Ga_{1-y2}N$ well layer. In certain embodiments, the $In_{x1}Ga_{1-x1}N$ interface layer and/or the $In_{x2}Ga_{1-x2}N$ interface layer may further include a small amount of Al (e.g., at a concentration not exceeding one-fourth, one-eighth, or one tenth, the In concentration therein). In certain embodiments, the $Al_{z2}Ga_{1-z2}N$ interface layer may further include a small amount of In (e.g., at a concentration not exceeding one-fourth, one-eighth, or one tenth, the Al concentration therein). In certain embodiments, each $In_{y1}Ga_{1-y1}N$ well layer and each $In_{y2}Ga_{1-y2}N$ well layer comprises a thickness in a range of from 15 Å to 40 Å. In certain embodiments, each $Al_{a1}In_{b1}Ga_{1-a1-b1}N$ barrier layer and each $Al_{a2}In_{b2}Ga_{1-a2-b2}N$ barrier layer comprises a thickness in a range of from 25 Å to 150 Å. In certain embodiments, 0<x1≤0.03, 0<x2≤0.03, and 0<z2≤0.03. In certain embodiments, b1<0.03 and/or b2<0.03. In certain embodiments, a1=0, a2=0, b1=0, and/or b2=0. In certain embodiments, the multiple sequentially arranged barrier-well units comprise a plurality of barrier-well units of the first type and a plurality of barrier-well units of the second type. In certain embodiments, the number of barrier-well units of the first type exceeds the number of barrier-well units of the second type present in the light emitting diode. In certain embodiments, at least one layer of at least one barrier-well unit is undoped. In certain embodiments, at least one layer of at least one barrier-well unit comprises a graded composition. In certain embodiments, the active region may be arranged between (but not necessarily directly contacting) a p-type Group III nitride based semiconductor layer and a n-type Group III nitride based semiconductor layer of the LED.

In certain embodiments, a light emitting diode comprises an active region comprising multiple sequentially arranged barrier-well units including a plurality of barrier-well units of a first type; wherein each barrier-well unit of the first type comprises an $Al_{a1}In_{b1}Ga_{1-a1-b1}N$ barrier layer (wherein at least one of the following is true: a1<0.2 and b1=0), an $In_{x1}Ga_{1-x1}N$ interface layer (wherein 0<x1<0.05 and x1<b1) contacting the $Al_{a1}In_{b1}Ga_{1-a1-b1}N$ barrier layer, and an $In_{y1}Ga_{1-y1}N$ well layer (wherein y1>0.10 and y1>2·b1) contacting the $In_{x1}Ga_{1-x1}N$ interface layer; and wherein the $In_{x1}Ga_{1-x1}N$ interface layer comprises a thickness of no greater than about 30% of the $In_{y1}Ga_{1-y1}N$ well layer. In certain embodiments, within each barrier-well unit of the first type, the $Al_{a1}In_{b1}Ga_{1-a1-b1}N$ barrier layer comprises a thickness in a range of from 25 Å to 150 Å, the $In_{x1}Ga_{1-x1}N$ interface layer comprises a thickness of no greater than about 10 Å (or no greater than about 4 Å), and the $In_{y1}Ga_{1-y1}N$ well layer comprises a thickness in a range of from 15 Å to 40 Å. In certain embodiments, 0<x1≤0.03. In certain embodiments, a1=0 and b1=0. In certain embodiments, within each barrier-well unit of the first type, at least one of the $Al_{a1}In_{b1}Ga_{1-a1-b1}N$ barrier layer and the $In_{x1}Ga_{1-x1}N$ interface layer is undoped. In certain embodiments, the active region further comprises at least one barrier-well unit of a second type comprising an $Al_{a2}In_{b2}Ga_{1-a2-b2}N$ barrier layer (wherein 0≤a2≤0.50 and 0≤b2≤0.10), an $In_{x2}Ga_{1-x2}N$ interface layer (wherein 0<x2≤0.05 and x2<b2) contacting the $Al_{a2}In_{b2}Ga_{1-a2-b2}N$ barrier layer, an $In_{y2}Ga_{1-y2}N$ well layer (wherein y2>0.10 and y2>2·b2) contacting the $In_{x2}Ga_{1-x2}N$ interface layer, and an $Al_{z2}Ga_{1-z2}N$ interface layer (wherein 0<z2≤0.05) contacting the $In_{y2}Ga_{1-y2}N$ well layer. In certain embodiments, the $In_{x1}Ga_{1-x1}N$ interface layer and/or the $In_{x2}Ga_{1-x2}N$ interface layer may further include a small amount of Al (e.g., at a concentration not exceeding one-fourth, one-eighth, or one tenth, the In concentration therein). In certain embodiments, the $Al_{z2}Ga_{1-z2}N$ interface layer may further include a small amount of In (e.g., at a concentration not exceeding one-fourth, one-eighth, or one tenth, the Al concentration therein). In certain embodiments, within the at least one barrier-well unit of the second type, the $In_{x2}Ga_{1-x2}N$ interface layer comprises a thickness of no greater than about 30% of the $In_{y2}Ga_{1-y2}N$ well layer and/or no greater than about 10 Å (or no greater than about 4 Å), and the $Al_{z2}Ga_{1-z2}N$ interface layer comprises a thickness of no greater than about 30% of the $In_{y2}Ga_{1-y2}N$ well layer and/or no greater than about 10 Å (or no greater than about 4 Å). In certain embodiments, the number of barrier-well units of the first type exceeds the number of barrier-well units of the second type present in the light emitting diode. In certain embodiments, three to twelve barrier-well units are provided. In certain embodiments, the active region may be arranged between (but not necessarily directly contacting) a p-type Group III nitride based semiconductor layer and a n-type Group III nitride based semiconductor layer of the LED.

In certain embodiments, a light emitting diode comprises an active region comprising multiple sequentially arranged barrier-well units including: at least one barrier-well unit of a first type, wherein each barrier-well unit of the first type comprises a first GaN barrier layer, a first $In_xGa_{1-x}N$ interface layer (wherein 0<x≤0.05) contacting the first GaN barrier layer, and a first $In_yGa_{1-y}N$ well layer (wherein y>0.10) contacting the first $In_xGa_{1-x}N$ interface layer; and at least one barrier-well unit of a second type, wherein each barrier-well unit of the second type comprises a second GaN barrier layer, a second $In_xGa_{1-x}N$ interface layer (wherein 0<x≤0.05) contacting the second GaN barrier layer, a second $In_yGa_{1-y}N$ well layer (wherein y>0.10) contacting the second $In_xGa_{1-x}N$ interface layer, and a second $Al_zGa_{1-z}N$ interface layer (wherein 0<z≤0.05) contacting the second $In_yGa_{1-y}N$ well layer. In certain embodiments, the first and/or second $In_{x1}Ga_{1-x1}N$ interface layer may further include a small amount of Al (e.g., at a concentration not exceeding one-fourth, one-eighth, or one tenth, the In concentration therein). In certain embodiments, the second $Al_zGa_{1-z}N$ interface layer may further include a small amount of In (e.g., at a concentration not exceeding one-fourth, one-eighth, or one tenth, the Al concentration therein). In certain embodiments, each interface layer comprises a thickness of no greater than about 30% of the corresponding well layer. In certain embodiments, 0<x≤0.03 and 0<z≤0.03. In certain embodiments, a plurality of barrier-well units of the first type and a plurality of barrier-well units of the second type are provided. In certain embodiments, the number of barrier-well units of the first type exceeds the number of barrier-well units of the second type present in the light emitting diode. In certain embodiments, each first $In_yGa_{1-y}N$ well layer and each second $In_yGa_{1-y}N$ well layer comprises a thickness in a range of from 15 Å to 40 Å. In certain embodiments, each first and second GaN barrier layer comprises a thickness in a range of from 25 Å to 150 Å. In certain embodiments, the light emitting diode is devoid of any layer having a lower bandgap than each first $In_yGa_{1-y}N$ well layer of the at least one barrier-well unit of the first type or each second $In_yGa_{1-y}N$ well layer of the at least one barrier-well unit of the second type. In certain embodiments, the active region may be arranged between (but not necessarily directly contacting) a p-type Group III nitride based semiconductor layer and a n-type Group III nitride based semiconductor layer of the LED.

The addition of Group III nitride interface layers as disclosed herein to barrier-well units of LED active regions may provide various effects. In certain embodiments, Group III nitride interface layers may comprise $Al_dIn_eGa_{(1-d-e)}N$ material, wherein 0<d+e<1. In certain embodiments, composition, thickness, position, number, and/or orientation of such interface layers may be adjusted to affect brightness, forward voltage, and/or thermal droop of a LED structure. For example, in certain embodiments at least one interface layer comprising $Al_dIn_eGa_{(1-d-e)}N$ material (wherein d<e, with the material including but not limited to InGaN) may be added to one or more barrier-well units of a LED active region may enhance brightness of a LED and result in increased forward voltage. As another example, in certain embodiments at least one interface layer comprising $Al_dIn_eGa_{(1-d-e)}N$ material (wherein d<e, with the material including but not limited to InGaN) may be added to one or more barrier-well units of a LED active region and result in decreased thermal droop, such as in a range of at least about 3% at a junction temperature of 85° C. (relative to a baseline structure lacking barrier-well units with such interface layers). As another example, in certain embodiments one or more interface layers comprising $Al_dIn_eGa_{(1-d-e)}N$ material (wherein d>e, with the material including but not limited to AlGaN) may be added to one or more barrier-well units of a LED active region and result in increased forward voltage of a resulting LED. Surprisingly, in certain embodiments, forward voltage may be reduced while a brightness increase may be maintained if at least one interface layer comprising $Al_dIn_eGa_{(1-d-e)}N$ material (wherein d>e, including but not limited to AlGaN) and at least one interface layer comprising $Al_dIn_eGa_{(1-d-e)}N$ material (wherein d<e, including but not limited to InGaN) are both provided in a single active region in the same or different barrier-well units (e.g., with the number of $Al_dIn_eGa_{(1-d-e)}N$ interface layers (wherein d<e, including but not limited to InGaN) exceeding the number of $Al_dIn_eGa_{(1-d-e)}N$ interface layers (wherein d>e, including but not limited to AlGaN) in certain embodiments, such that some but not all barrier-well units include an $Al_dIn_eGa_{(1-d-e)}N$ interface layer (wherein d>e, including but not limited to AlGaN)).

In certain embodiments, some but not all barrier-well units comprise at least one $Al_dIn_eGa_{(1-d-e)}N$ interface layer. In certain embodiments, an active region may include equal numbers of interface layer(s) comprising $Al_dIn_eGa_{(1-d-e)}N$ (wherein d>e, including but not limited to AlGaN) and interface layer(s) comprising $Al_dIn_eGa_{(1-d-e)}N$ material (wherein d<e, including but not limited to InGaN), which may be applied to some or all barrier-well units of the active region. In certain embodiments, an active region may include multiple barrier-well units wherein fewer than all barrier-well units comprise an $Al_d In_e Ga_{(1-d-e)}N$ (wherein d>e, including but not limited to AlGaN) interface layer. In certain embodiments, an active region may include multiple barrier-well units wherein fewer than all barrier-well units comprise an $Al_d In_e Ga_{(1-d-e)}N$ (wherein d<e, including but not limited to InGaN) interface layer.

In certain embodiments, composition of interface layers (e.g., $Al_d In_e Ga_{(1-d-e)}N$ interface layers) may differ among different barrier-well units in a single active region. In certain embodiments, a relative fraction of aluminum in $Al_d In_e Ga_{(1-d-e)}N$ interface layers and/or an average aluminum content of $Al_d In_e Ga_{(1-d-e)}N$ interface layers, may increase among different barrier-well units with increased proximity to (i.e., with decreasing distance from) a P-side of a LED. In certain embodiments, a relative fraction of indium in $Al_d In_e Ga_{(1-d-e)}N$ interface layers and/or an average indium content of $Al_d In_e Ga_{(1-d-e)}N$ interface layers, may increase among different barrier-well units with increased proximity to (i.e., with decreasing distance from) to a N-side of a LED.

In certain embodiments, $Al_d In_e Ga_{(1-d-e)}N$ interface layers (wherein d>0 and d≥e, including but not limited to AlGaN) are present in barrier-well units closest to a P-side of a LED (e.g., in any one or more of the first, second, third, or fourth barrier-well units closest to a P-side). In certain embodiments, $Al_d In_e Ga_{(1-d-e)}N$ interface layers (wherein e>0 and e≥d, including but not limited to InGaN) are present in barrier-well units closest to a N-side of a LED (e.g., in any one or more of the first, second, third, or fourth barrier-well units closest to a N-side). In certain embodiments, barrier-well units comprising $Al_d In_e Ga_{(1-d-e)}N$ interface layers (wherein d>0 and d≥e, including but not limited to AlGaN) may be arranged in alternating fashion to barrier-well units comprising $Al_d In_e Ga_{(1-d-e)}N$ interface layers (wherein e>0 and e≥d, including but not limited to InGaN).

In certain embodiments, a number of $Al_d In_e Ga_{(1-d-e)}N$ interface layers (wherein d>0 and d≥e, including but not limited to AlGaN) is not equal to a number of $Al_d In_e Ga_{(1-d-e)}N$ interface layers (wherein e>0 and e≥d, including but not limited to InGaN) within an active region of a LED. In certain embodiments, $Al_d In_e Ga_{(1-d-e)}N$ interface layers (wherein d>0 and d≥e, including but not limited to AlGaN) and/or $Al_d In_e Ga_{(1-d-e)}N$ interface layers (wherein e>0 and e≥d, including but not limited to InGaN) are arranged in an asymmetric manner within an active region of a LED.

Embodiments disclosed herein may provide one or more of the following beneficial technical effects: enhance luminous flux, enhanced efficiency, reduced thermal droop, reduced current droop, and/or reduce forward voltage of light emitting diodes.

While specific aspects, features and illustrative embodiments have been disclosed herein, it will be appreciated that the disclosure extends to and encompasses numerous other variations, modifications, and alternative embodiments, as will suggest themselves to those of ordinary skill in the pertinent art, based on the disclosure herein. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A light emitting diode comprising:
   an active region comprising a plurality of sequentially arranged barrier-well units;
   wherein each barrier-well unit comprises a Group III nitride barrier layer comprising a first bandgap and a Group III nitride well layer comprising a second bandgap;
   wherein at least one barrier-well unit of the plurality of sequentially arranged barrier-well units, additionally comprises a first Group III nitride interface layer comprising a third bandgap;
   wherein the first bandgap is greater than the second bandgap, and the third bandgap is greater than the first bandgap; and
   wherein the first Group III nitride interface layer comprises a continuous variation of composition with respect to thickness of the first Group III nitride interface layer.

2. The light emitting diode of claim 1, wherein fewer than all barrier-well units of the plurality of barrier-well units comprises a first Group III nitride interface layer comprising a third bandgap.

3. The light emitting diode of claim 1, wherein the first Group III nitride interface layer comprises a thickness of no greater than 10 Å.

4. The light emitting diode of claim 1, wherein the first Group III nitride interface layer comprises a thickness of no greater than 4 Å.

5. The light emitting diode of claim 1, wherein the first Group III nitride interface layer comprises a thickness of no greater than about 30% of the Group III nitride well layer.

6. The light emitting diode of claim 1, wherein in the at least one barrier-well unit, the first Group III nitride interface layer is in contact with the Group III nitride well layer and is in contact with the Group III nitride barrier layer of an adjacent barrier-well unit of the plurality of sequentially arranged barrier-well units.

7. The light emitting diode of claim 1, wherein at least one barrier-well unit of the plurality of sequentially arranged barrier-well units comprises a second Group III nitride interface layer comprising a fourth bandgap, wherein the fourth bandgap is greater than the second bandgap, and wherein the first bandgap is greater than the fourth bandgap.

8. The light emitting diode of claim 7, wherein for the at least one barrier-well unit that comprises the second Group III nitride interface layer, the second Group III nitride interface layer is provided between and in contact with the Group III nitride barrier layer and the Group III nitride well layer.

9. The light emitting diode of claim 1, wherein the first Group III nitride interface layer comprises a linear variation of composition with respect to thickness of the first Group III nitride interface layer.

10. The light emitting diode of claim 1, wherein the first Group III nitride interface layer comprises a curvilinear variation of composition with respect to thickness of the first Group III nitride interface layer.

11. A light emitting diode comprising:
    an active region comprising a plurality of sequentially arranged barrier-well units;
    wherein the plurality of sequentially arranged barrier-well units comprises at least one barrier-well unit of a first type, and each barrier-well unit of the first type comprises a Group III nitride barrier layer comprising a first bandgap, a Group III nitride well layer comprising a second bandgap, a first Group III nitride interface layer comprising a third bandgap, and a second Group III nitride interface layer comprising a fourth bandgap;

wherein the third bandgap is greater than the second bandgap, the first bandgap is greater than the third bandgap, and the fourth bandgap is greater than the first bandgap;

wherein the first Group III nitride interface layer comprises a continuous variation of composition with respect to thickness of the first Group III nitride interface layer; and wherein the second Group III nitride interface layer comprises a continuous variation of composition with respect to thickness of the second Group III nitride interface layer.

12. The light emitting diode of claim 11, comprising at least one of the following features (a) and (b):
  (a) the first Group III nitride interface layer comprises a thickness of no greater than 10 Å;
  (b) the second Group III nitride interface layer comprises a thickness of no greater than 10 Å.

13. The light emitting diode of claim 11, comprising at least one of the following features (a) and (b):
  (a) the first Group III nitride interface layer comprises a thickness of no greater than 4 Å;
  (b) the second Group III nitride interface layer comprises a thickness of no greater than 4 Å.

14. The light emitting diode of claim 11, comprising at least one of the following features (a) and (b):
  (a) the first Group III nitride interface layer comprises a thickness of no greater than about 30% of a thickness of the Group III nitride well layer;
  (b) the second Group III nitride interface layer comprises a thickness of no greater than about 30% of a thickness of the Group III nitride well layer.

15. The light emitting diode of claim 11, wherein in the at least one barrier-well unit of the first type, the first Group III nitride interface layer is arranged between and in contact with the Group III nitride barrier layer and the Group III nitride well layer, and the second Group III nitride interface layer is arranged in contact with the Group III nitride well layer.

16. The light emitting diode of claim 11, wherein for the at least one barrier-well-unit of the first type, at least one of the first Group III nitride interface layer or the second Group III nitride interface layer comprises a linear variation of composition with respect to thickness of the first Group III nitride interface layer.

17. The light emitting diode of claim 11, wherein for the at least one barrier-well-unit of the first type, at least one of the first Group III nitride interface layer or the second Group III nitride interface layer comprises a curvilinear variation of composition with respect to thickness of the first Group III nitride interface layer.

18. The light emitting diode of claim 11, wherein the plurality of sequentially arranged barrier-well units comprises at least one barrier-well unit of a second type that differs from the first type.

* * * * *